(12) United States Patent
Gosen et al.

(10) Patent No.: US 12,354,891 B2
(45) Date of Patent: Jul. 8, 2025

(54) PARTICLE BEAM INSPECTION APPARATUS

(71) Applicant: ASML Netherlands B.V., Veldhoven (NL)

(72) Inventors: Jeroen Gerard Gosen, Westport, CT (US); Te-Yu Chen, San Jose, CA (US); Dennis Herman Caspar Van Banning, Best (NL); Edwin Cornelis Kadijk, Eindhoven (NL); Martijn Petrus Christianus Van Heumen, Santa Clara, CA (US); Erheng Wang, San Jose, CA (US); Johannes Andreas Henricus Maria Jacobs, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/423,199

(22) Filed: Jan. 25, 2024

(65) Prior Publication Data
US 2024/0258138 A1     Aug. 1, 2024

Related U.S. Application Data

(63) Continuation of application No. 17/811,047, filed on Jul. 6, 2022, now Pat. No. 11,942,340, which is a
(Continued)

(51) Int. Cl.
*H01L 21/67* (2006.01)
*G03F 7/00* (2006.01)

(52) U.S. Cl.
CPC .... *H01L 21/67201* (2013.01); *G03F 7/70841* (2013.01); *G03F 7/70858* (2013.01); *H01L 21/67098* (2013.01)

(58) Field of Classification Search
CPC ......... H01L 21/67201; H01L 21/67098; H01L 21/67167; H01L 21/67178; H01L 21/6719;
(Continued)

(56) References Cited

U.S. PATENT DOCUMENTS

| 5,314,541 A | 5/1994 | Saito |
| 5,944,940 A | 8/1999 | Tashima |

(Continued)

FOREIGN PATENT DOCUMENTS

| CN | 101986208 A | 3/2011 |
| CN | 102275739 A | 12/2011 |

(Continued)

OTHER PUBLICATIONS

Office Action of the Intellectual Property Office of Taiwan issued in related Taiwanese Patent Application No. 110127856; mailed Jan. 19, 2023 (11 pgs.).
(Continued)

*Primary Examiner* — David P Porta
*Assistant Examiner* — Gisselle M Gutierrez
(74) *Attorney, Agent, or Firm* — FINNEGAN, HENDERSON, FARABOW, GARRETT & DUNNER, LLP.

(57) ABSTRACT

An improved particle beam inspection apparatus, and more particularly, a particle beam inspection apparatus including an improved load lock unit is disclosed. An improved load lock system may comprise a plurality of supporting structures configured to support a wafer and a conditioning plate including a heat transfer element configured to adjust a temperature of the wafer. The load lock system may further comprise a gas vent configured to provide a gas between the conditioning plate and the wafer and a controller configured to assist with the control of the heat transfer element.

20 Claims, 19 Drawing Sheets

Related U.S. Application Data continuation of application No. 16/514,843, filed on Jul. 17, 2019, now Pat. No. 11,430,678.

(60) Provisional application No. 62/869,986, filed on Jul. 2, 2019, provisional application No. 62/699,643, filed on Jul. 17, 2018.

(58) Field of Classification Search
CPC ......... H01L 21/67742; H01L 21/67751; H01L 21/67126; H01L 21/67017; H01L 21/67248; H01L 21/6875; G03F 7/70841; G03F 7/70858

See application file for complete search history.

(56) References Cited

U.S. PATENT DOCUMENTS

| | | |
|---|---|---|
| 6,110,232 A | 8/2000 | Chen |
| 6,402,401 B1 | 6/2002 | Ueda |
| 7,394,520 B2 | 7/2008 | Klomp |
| 8,404,603 B2 | 3/2013 | Ogawa |
| 10,896,821 B2 | 1/2021 | Liu |
| 2002/0034886 A1 | 3/2002 | Kurita et al. |
| 2002/0062790 A1 | 5/2002 | Ikeda |
| 2005/0054217 A1 | 3/2005 | Klomp et al. |
| 2005/0284572 A1 | 12/2005 | Chen |
| 2006/0181699 A1 | 8/2006 | Numakura |
| 2007/0122551 A1 | 5/2007 | Yamamoto |
| 2007/0280816 A1 | 12/2007 | Kurita et al. |
| 2009/0148604 A1 | 6/2009 | Visser et al. |
| 2010/0139889 A1 | 6/2010 | Kurita et al. |
| 2012/0070564 A1 | 3/2012 | Winter |
| 2012/0282713 A1 | 11/2012 | Tanaka |
| 2013/0112223 A1 | 5/2013 | Nakaharada |
| 2013/0112224 A1 | 5/2013 | Nakaharada |
| 2014/0271054 A1 | 9/2014 | Weaver |
| 2016/0189993 A1 | 6/2016 | Nakagawa |
| 2017/0031245 A1 | 2/2017 | Nagahara |
| 2018/0163306 A1 | 6/2018 | Swaminathan |
| 2018/0240684 A1 | 8/2018 | Egashira |
| 2019/0287829 A1 | 9/2019 | Saido |
| 2020/0144019 A1 | 5/2020 | Van Heumen |
| 2021/0098401 A1 | 4/2021 | Zhang |
| 2022/0122861 A1 | 4/2022 | Huang |
| 2022/0199398 A1 | 6/2022 | Wada |

FOREIGN PATENT DOCUMENTS

| | | | |
|---|---|---|---|
| CN | 108028193 A | 5/2018 | |
| EP | 3 575 873 A1 | 12/2019 | |
| JP | H07-193115 A | 7/1995 | |
| JP | 2001-222099 A | 8/2001 | |
| JP | 2003152046 A | 5/2003 | |
| JP | 2006-273563 A | 10/2006 | |
| JP | 2006-303013 A | 11/2006 | |
| JP | 2009-124142 A | 6/2009 | |
| JP | 2009-540547 T | 11/2009 | |
| TW | I842517 B * | 5/2024 | ....... H01L 21/67126 |

OTHER PUBLICATIONS

Notification of Reason(s) for Refusal by the Korean Patent Office issued in related Korean Patent Application No. 10-2021-7001541; mailed Apr. 27, 2022 (16 pgs.).

Notice of Reasons for Rejection issued in related Japanese Patent Application No. 2020-572986; mailed Feb. 15, 2022 (9 pgs.).

* cited by examiner

PARTICLE BEAM INSPECTION APPARATUS

CROSS-REFERENCE TO RELATED APPLICATIONS

This application is a continuation of U.S. Non-Provisional patent application Ser. No. 17/811,047, filed on Jul. 6, 2022, which is a continuation of U.S. Non-Provisional patent application Ser. No. 16/514,843, filed on Jul. 17, 2019 (now U.S. Pat. No. 11,430,678), which claims priority of U.S. application 62/699,643, which was filed on Jul. 17, 2018; and of U.S. application 62/869,986, which was filed on Jul. 2, 2019; all these applications are incorporated herein by reference in their entireties.

FIELD

The embodiments provided herein disclose a particle beam inspection apparatus, and more particularly, a particle beam inspection apparatus including an improved load lock unit.

BACKGROUND

When manufacturing semiconductor integrated circuit (IC) chips, pattern defects and/or uninvited particles (residuals) inevitably appear on a wafer and/or a mask during fabrication processes, thereby reducing the yield to a great degree. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In the SEM, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface.

During operation of an inspection tool, the wafer is typically held by a wafer stage. The inspection tool may comprise a wafer positioning device for positioning the wafer stage and wafer relative to the e-beam. This may be used to position a target area on the wafer, i.e. an area to be inspected, in an operating range of the e-beam.

SUMMARY

The embodiments provided herein disclose a particle beam inspection apparatus, and more particularly, a particle beam inspection apparatus including an improved load lock unit. In some embodiments, the improved load lock system includes a plurality of supporting structures configured to support a wafer and a first conditioning plate. The first conditioning plate includes a first heat transfer element configured to adjust a temperature of the wafer. The improved load lock system also includes a first gas vent configured to provide a gas between the first conditioning plate and the wafer. Furthermore, the improved load lock system includes a controller including a processor and a memory. The controller is configured to assist with control of the first heat transfer element.

In some embodiments, a method of conducting a thermal conditioning of a wafer in a load lock system is provided. The method includes loading a wafer to a load lock chamber of a load lock system and pumping down the load lock chamber. The method further includes providing a gas to the load lock chamber. The method also includes enabling a first heat transfer element in a first conditioning plate to adjust a temperature of the first conditioning plate for transferring heat through the gas to the wafer.

In some embodiments, a non-transitory computer readable medium is provided. The non-transitory computer readable medium includes a set of instructions that is executable by one or more processors of a controller to cause the controller to perform a method conducting a thermal conditioning of a wafer. The method includes instructing a vacuum pump to pump down a load lock chamber of a load lock system after a wafer is loaded into the load lock chamber. The method also includes instructing a gas supply to provide a gas to the load lock chamber and instructing a first heat transfer element in a first conditioning plate to adjust a temperature of the first conditioning plate for transferring heat through the gas to the wafer.

In some embodiments, a method of pumping down a load lock chamber is provided. The method includes pumping a gas out of the load lock chamber with a first vacuum pump configured to exhaust the gas to a first exhaust system and pumping the gas out of the load lock chamber with a second vacuum pump configured to exhaust the gas to a second exhaust system.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1A:
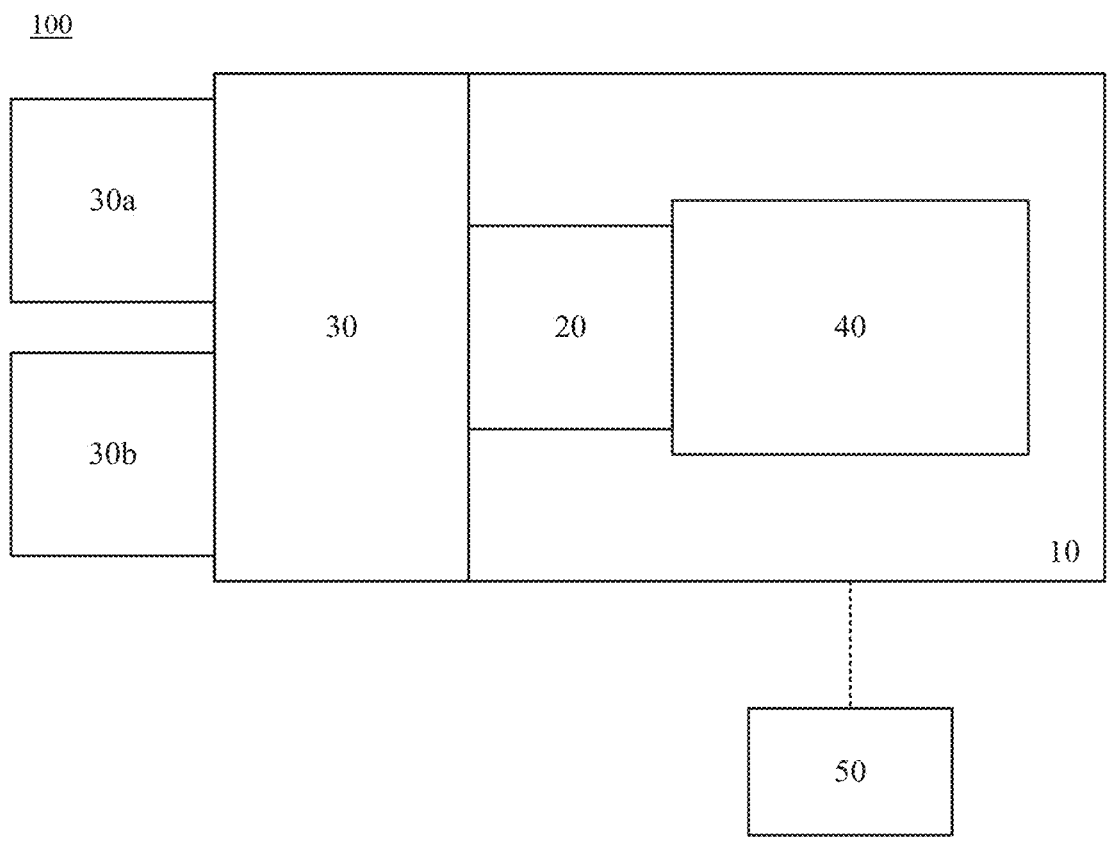
FIG. 1A is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to occur again.

While high process yield is desirable in an IC chip manufacturing facility, it is also essential to maintain a high wafer throughput, defined as the number of wafers processed per hour. High process yields and high wafer throughput can be impacted by the presence of defects, especially when there is operator intervention to review the defects. Thus, high throughput detection and identification of micro and nano-sized defects by inspection tools (such as a SEM) is essential for maintaining high yields and low cost.

One aspect of the present disclosure includes an improved load lock system that increases the throughput of the overall inspection system. The improved load lock system prepares a wafer in a manner that speeds up the inspection process when compared to conventional particle beam inspection systems. For example, an operator, who is inspecting a wafer using the conventional particle beam inspection system, needs to wait for the wafer to be temperature stabilized before starting the inspection. This temperature stabilization is required because the wafer changes size as the temperature changes, which causes elements on the wafer to move as the wafer expands or contracts. For example, FIG. 1C shows that elements 180, 182, 184, and 186 can move to new locations 170, 172, 174, and 178 as a wafer 160 expands due to the temperature change. And when the precision for inspecting a wafer is in nanometers, this change in location is substantial. Accordingly, for the operator to precisely locate and inspect the elements on the wafer, the operator must wait until the wafer temperature stabilizes.

The improved load lock system conditions the wafer so that its temperature is close to a temperature of an inspection wafer stage that will hold the wafer. The improved load lock system can condition the wafer by including a conditioning plate that transfers heat to or from the wafer before it is placed onto the wafer stage. By conditioning the wafer before it is placed onto the wafer stage, the inspection can begin with much less delay. Therefore, the operator can inspect more wafers within a given period of time, thereby achieving an increased throughput.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1A, which is a schematic diagram illustrating an exemplary charged particle beam inspection system 100, consistent with embodiments of the present disclosure. As shown in FIG. 1A, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present invention to specific charged particles. It is further appreciated that electron beam tool 40 can be a single-beam tool that utilizes a single electron beam or a multi-beam tool that utilizes multiple electron beams.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (e.g., the robotic arms shown in FIG. 1B) in EFEM 30 transport the wafers to load lock chamber 20.

Load lock chamber 20 may be attached to main chamber 10 with a gate valve (e.g., gate valve 26 of FIG. 1B) between the chambers. Load lock chamber 20 may include a sample holder (not shown) that can hold one or more wafers. Load lock chamber 20 may also include a mechanical transfer apparatus (e.g., robot arm 12 of FIG. 1B) to move wafers to and from main chamber 10. Load lock chamber 20 may be connected to a load lock vacuum pump system (not shown), which removes gas molecules in load lock chamber 20 to reach a first pressure below the atmospheric pressure. After reaching the first pressure, one or more robot arms (shown in FIG. 1B) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40.

A controller 50 is electronically connected to electron beam tool 40. Controller 50 may be a computer configured to execute various controls of charged particle beam inspection system 100. While controller 50 is shown in FIG. 1A as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 1B:
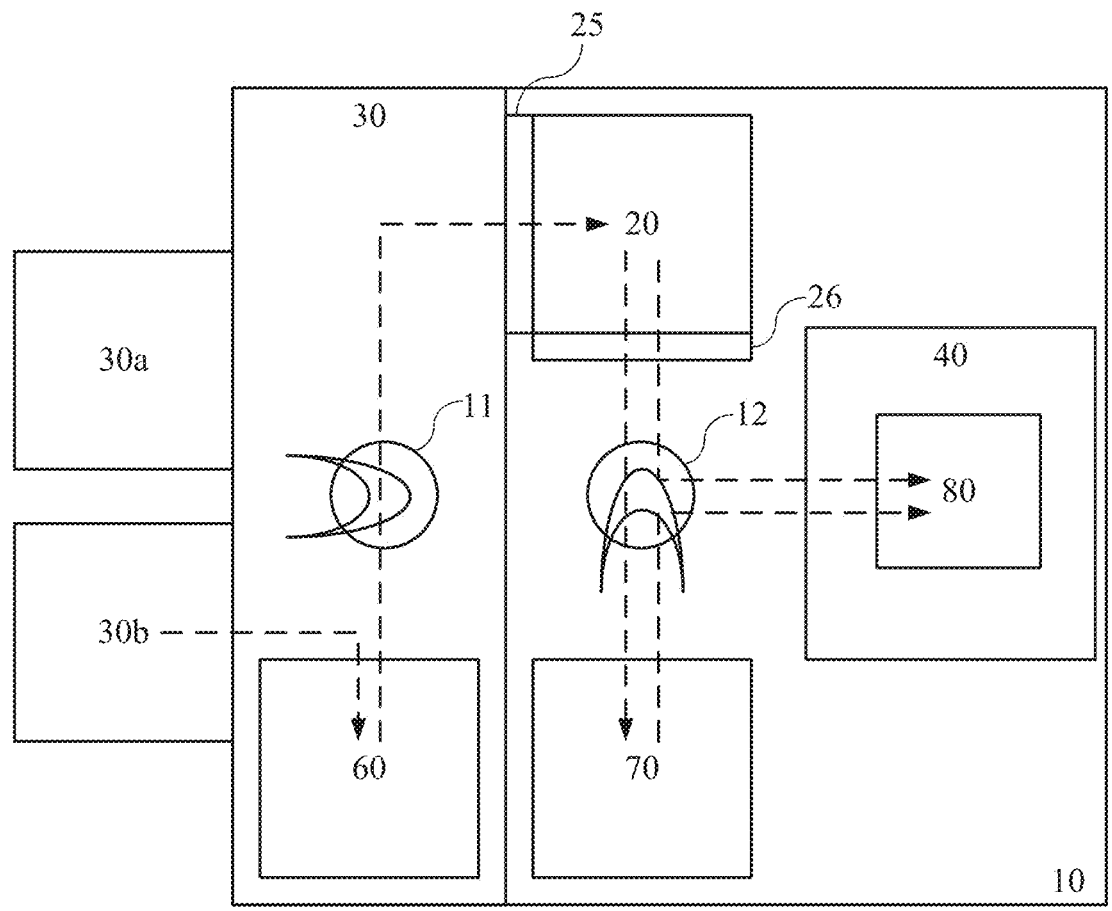
FIG. 1B is a schematic diagram illustrating an exemplary wafer loading sequence in the charged particle beam inspection system of FIG. 1A, consistent with embodiments of the present disclosure.
Figure 1C:
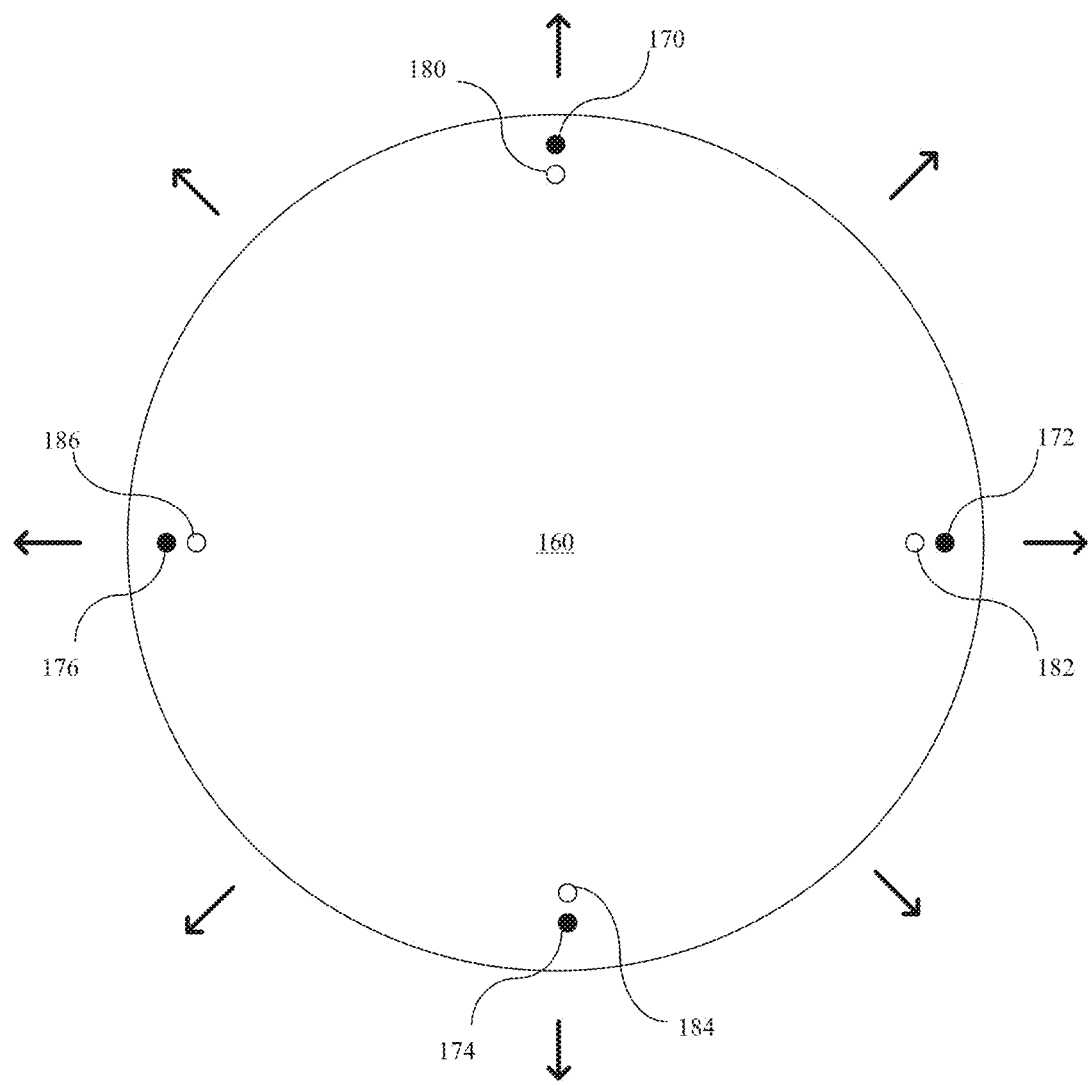
FIG. 1C is a schematic diagram illustrating an exemplary wafer deformation effect in a charged particle beam inspection system.

Reference is now made to FIG. 1B, which is a schematic diagram illustrating an exemplary wafer loading sequence in charged particle beam inspection system 100 of FIG. 1A, consistent with embodiments of the present disclosure. In some embodiments, charged particle beam inspection system 100 may include a robot arm 11 located in EFEM 30 and a robot arm 12 located in main chamber 10. In some embodiments, EFEM 30 may also include a pre-aligner 60 configured to position a wafer accurately before transporting the wafer to load lock chamber 20.

In some embodiments, first loading port 30a and second loading port 30b, for example, may receive wafer front opening unified pods (FOUPs) that contain wafers. Robot arm 11 in EFEM 30 may transport the wafers from any of the loading ports to pre-aligner 60 for assisting with the positioning. Pre-aligner 60 may use mechanical or optical aligning methods to position the wafers. After pre-alignment, robot arm 11 may transport the wafers to load lock chamber 20.

After the wafers are transported to load lock chamber 20, a load lock vacuum pump (not shown) may remove gas molecules in load lock chamber 20 to reach a first pressure below the atmospheric pressure. After reaching the first pressure, a robot arm 12 may transport the wafer from load lock chamber 20 to a wafer stage 80 of electron beam tool 40 in main chamber 10. Main chamber 10 is connected to a main chamber vacuum pump system (not shown), which removes gas molecules in main chamber 10 to reach a second pressure below the first pressure. After reaching the second pressure, the wafer may be subject to inspection by electron beam tool.

In some embodiments, main chamber 10 may include a parking station 70 configured to temporarily store a wafer before inspection. For example, when the inspection of a first wafer is completed, the first wafer may be unloaded from wafer stage 80, and then a robot arm 12 may transport a second wafer from parking station 70 to wafer stage 80. Afterwards, robot arm 12 may transport a third wafer from load lock chamber 20 to parking station 70 to store the third wafer temporarily until the inspection for the second wafer is finished.

Figure 2:
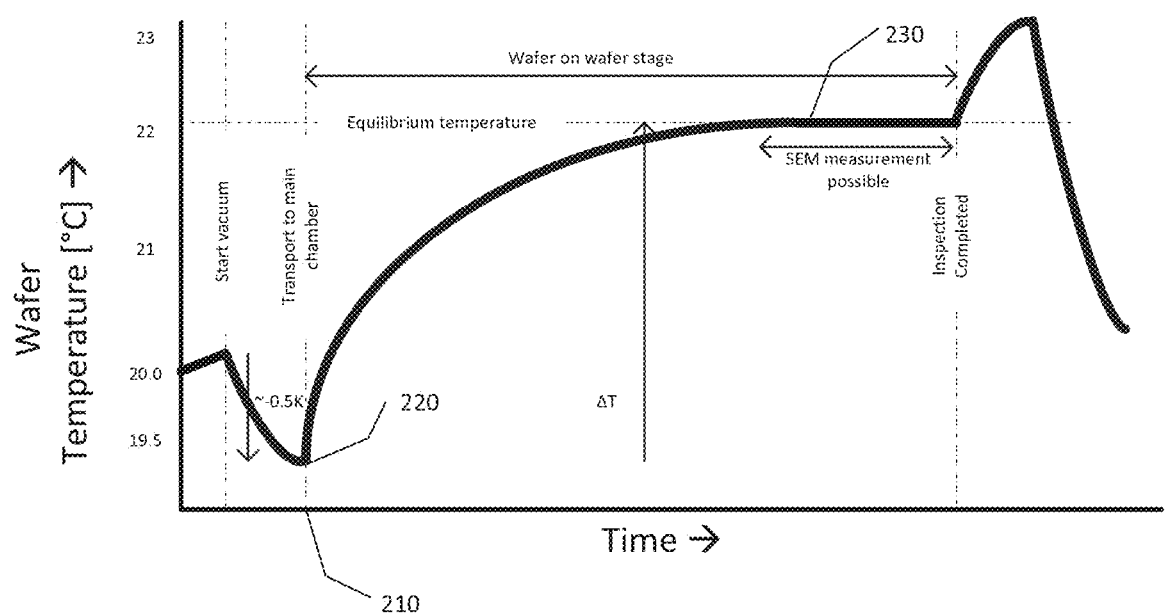
FIG. 2 is an exemplary graph showing a wafer temperature change over time in a charged particle beam inspection system.

Reference is now made to FIG. 2, which is an exemplary graph showing a wafer temperature change over time for a charged particle beam inspection system. The vertical axis represents temperature change, and the horizontal axis represents passage of time. The graph shows that the wafer temperature changes over time while the wafer is processed through multiple stages of wafer load sequence. According to the exemplary data shown in FIG. 2, when a FOUP, containing wafers to be inspected, is loaded to first loading port 30a or second loading port 30b, the temperature of the wafer is approximately 22.5 degrees.

After the wafer is transported to a load lock chamber, the wafer temperature sharply drops almost one degree when the load lock chamber is pumped down to a vacuum. This sudden temperature drop may be referred to as a pump-down effect. Subsequently, when the wafer is transported and loaded onto the wafer stage, the wafer and the wafer stage may be at different temperatures. For example, the graph in FIG. 2 shows that, when the wafer is loaded to wafer stage (annotated in FIG. 2 as 210), there may be roughly a 2.5-degree temperature difference between the wafer located in the load lock chamber (annotated in FIG. 2 as 220) and the wafer stage located in the main chamber (annotated in FIG. 2 as 230). Under such circumstances, heat transfer may occur between the wafer and the wafer stage, thereby resulting in a deformation (e.g. a thermal expansion shown in FIG. 1C) of the wafer (or the wafer stage). While the wafer stage or wafer is undergoing a thermal deformation, the inspection of the target area may not be possible or may have a reduced accuracy. Thus, to perform a more accurate inspection, the system waits for a significant period of time until the wafer temperature stabilizes before an inspection can commence. This waiting time reduces the throughput of the inspection system.

An example of wafer stage for quicker temperature stabilization may be found in European Patent Application No. EP18174642.1, titled PARTICLE BEAM APPARATUS and filed on May 28, 2018, which is incorporated by reference in its entirety. Another way to cope with this long stabilization time is conditioning the wafer temperature by pre-heating or pre-cooling the wafer to match the temperature of the wafer stage before the wafer is loaded onto the wafer stage. In such embodiments, the conditioning step may be performed while the previous wafer is inspected on the wafer stage, and therefore, the overall throughput of the inspection system may be increased compared to a system in which the conditioning is performed after the wafer is loaded onto the wafer stage.

In some embodiments, the temperature conditioning function may be implemented in a load lock chamber, which may provide throughput improvement as well as flexibility for the future. If the temperature conditioning of the wafer is performed in the load lock chamber, the wafer next in the pipeline can be loaded into load lock chamber while an inspection of previous wafer is in progress. In some examples, it is calculated that, in this sequence, the maximum available time to condition a wafer would be approximately 5-10 minutes, which is about the minimum inspection time of a wafer with the shortest user case in scope now. Therefore, one of the advantages of performing the wafer temperature conditioning in the load lock chamber is that the wafer conditioning time can be hidden under the inspection time because the conditioning of the next wafer and the inspection of the current wafer can occur simultaneously. This may improve the overall throughput of the particle beam inspection system.

In some embodiments, a charged particle beam inspection system (such as charged particle beam inspection system 100 of FIG. 1B) may include a coarse temperature conditioner and a fine temperature conditioner. For example, a pre-aligner (such as pre-aligner 60 of FIG. 1B) may include a coarse conditioner, while a load lock chamber (such as load lock chamber 20) includes a fine conditioner. The coarse conditioner may condition the wafer from, for example, a coarse offset of 2 degrees to 500 mk, while the fine conditioner can condition the wafer from, for example, a fine offset of 500 mK to 50 mK.

Figure 3A:
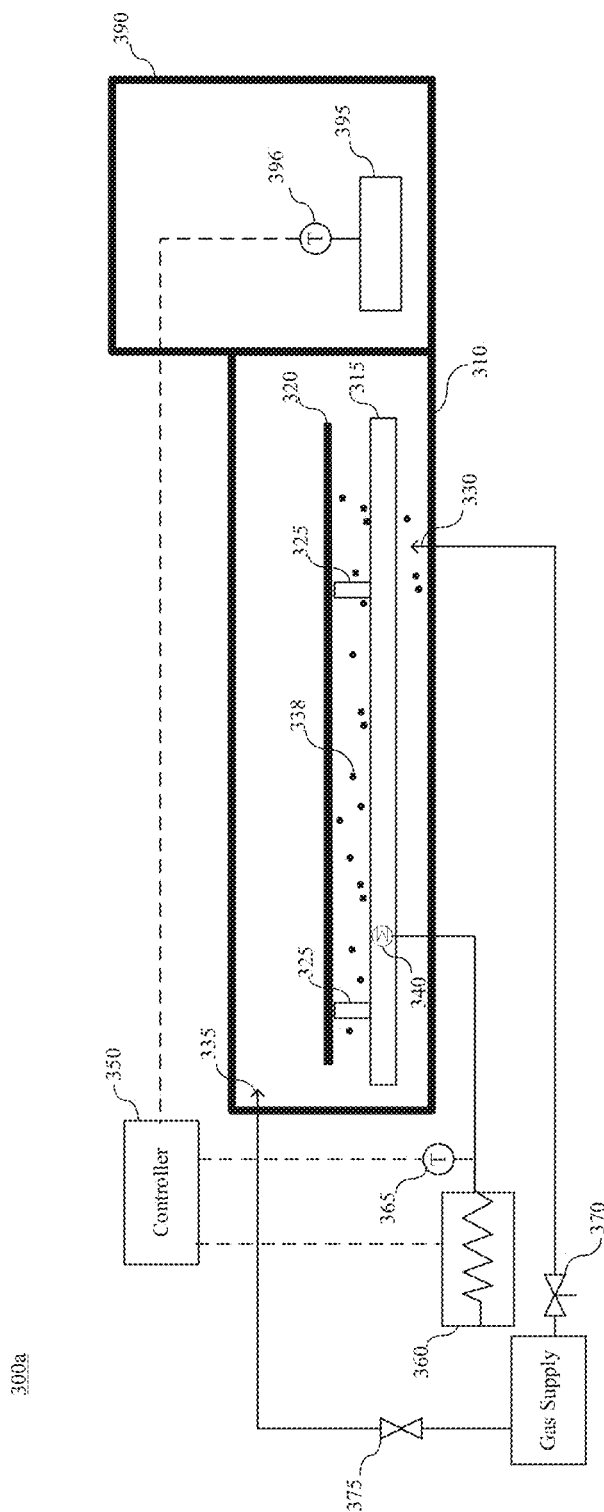
FIGS. 3A and 3B are schematic diagrams illustrating exemplary load lock systems, consistent with embodiments of the present disclosure.

Reference is now made to FIG. 3A, which shows an exemplary load lock system 300a, consistent with embodiments of the present disclosure. In some embodiments, load lock system 300a may include a plurality of supporting structures 325 and a conditioning plate 315 configured to transfer heat to wafer 320. In other embodiments, conditioning plate 315 may be configured to additionally or alternatively transfer heat from wafer 320. Supporting structures 325, coupled to conditioning plate 315, may support wafer 320 such that there is a space between wafer 320 and conditioning plate 315. While it is appreciated that more efficient heat transfer may be achieved as wafer 320 is positioned closer to conditioning plate 315, in some embodiments, it may be desirable to have sufficient distance in between wafer 320 and conditioning plate 315 to provide space for a robot arm to lift or transport wafer 320. In some embodiments, the distance between wafer 320 and conditioning plate 315 may be in a range of 1.5 mm to 10 mm to provide space to accommodate a variety of robot arm sizes in lifting or transporting a wafer. In some embodiments, the distance between wafer 320 and conditioning plate 315 may be in a range of 3 mm to 5 mm to provide space to accommodate a certain type of robot arms while providing more efficient heat transfer, without requiring a special treatment for robot arm transportation. In some embodiments, a special mechanism for lifting wafer 320 may be used, allowing the distance to be narrower.

Furthermore, even if two supporting structures 325 are shown in FIG. 3A, it is appreciated that system 300a may include any number of supporting structures 325. In some embodiments, wafer 320 may be passively placed on top of supporting structures 325 without any means of active coupling (e.g. electrostatic clamping). In other embodiments, wafer 320 may be held onto supporting structures 325 using an active holding mean, such as electrostatic clamping.

Load lock system 300a may include a load lock chamber 310, such as load lock chamber 20 of FIG. 1A. In some embodiments, load lock chamber 310 may be configured to change the internal pressure between atmospheric and vacuum. A pump, such as a turbo pump (not shown), may be connected to load lock chamber 310 to maintain a vacuum level at an appropriate level for conditioning the temperature of wafer 320. It is appreciated that the pump may be a type of pump different from a turbo pump as long as the pump is suitable for establishing a vacuum in load lock chamber 310.

In some embodiments, conditioning plate 315 may include a heat transfer element 340 configured to change the temperature of conditioning plate 315, which in turn affect the temperature of wafer 320. Heat transfer element 340 may be coupled to a heater/cooler 360. In some embodiments, heater/cooler 360 may be placed outside of load lock chamber 310. In other embodiments, heater/cooler 360 may be placed inside of load lock chamber 310.

Load lock system 300a may further include a controller 350 configured to adjust heater/cooler 360 or heat transfer element 340 to change the temperature of conditioning plate 315, which in turn affects the temperature of wafer 320. In some embodiments, controller 350 may receive a stage-temperature data about the temperature of wafer stage 395 in a main chamber 390. For example, in some embodiments, controller 350 may receive an electric signal conveying the stage-temperature data from a temperature sensor 396 configured to measure the temperature of wafer stage 395. In such embodiments, controller 350 may control heater/cooler 360 to adjust the temperature of conditioning plate 315 based on the stage-temperature data about the temperature of wafer stage 395.

In some embodiments, controller 350 may receive a heater-temperature data about the temperature of output of heater/cooler 360. In such embodiments, controller 350 may control heater/cooler 360 to adjust the temperature of conditioning plate 315 based on the heater-temperature data. For example, in some embodiments, heater/cooler 360 may be a water heater or water cooler. In such embodiments, heated or cooled water flows through heat transfer elements 340 in conditioning plate 315, and controller 350 may receive the heater-temperature data about the temperature of water at the output of heater/cooler 360. Controller 350 may adjust heater/cooler 360 based on the water temperature. In some embodiments, controller 350 may receive an electric signal conveying the heater-temperature data from a temperature sensor 365 configured to measure the temperature of water. In some embodiments, controller 350 may use both stage-temperature data and heater-temperature data to adjust the temperature of conditioning plate 315. In such embodiments, for example, controller 350 may adjust heater/cooler 360 to match the heater temperature (e.g. water temperature at the output of heater/cooler 360) to the temperature of wafer stage 395.

In some embodiments, controller 350 may be further optimized with additional temperature sensors. For example, in some embodiments, system may include one or more additional sensors configured to measure the temperature of wafer 320 and conditioning plate 315.

In some embodiments, load lock system 300a may include one or more gas vents (e.g., gas vents 330 or 335) to feed gas 338 from a gas supply into load lock chamber 310. In such embodiments, gas 338 may increase thermal conduction between wafer 320 and conditioning plate 315, resulting in a reduced time for wafer 320 to reach the stable temperature. For example, heat transfer between wafer 320 and conditioning plate 315 may be created by radiation and gas 338. Gas 338 may be nitrogen, helium, hydrogen, argon, $CO_2$, or compressed dry air. It is appreciated that gas 338 may be any other gas suitable for heat transfer. There may be valves 370 and 375 located between the gas supply and load lock chamber 310. Gas vents 330 and 335 may be connected to gas supply through gas tubes running from the gas supply to vents 330 and 335, which may be opened into load lock chamber 310 to provide gas between wafer 320 and conditioning plate 315. In some embodiments, gas vents 330 and 335 may be opened after load lock chamber is pumped down to vacuum level. In some embodiments, while gas 338 is supplied into load lock chamber 310, the load lock vacuum pump (e.g. turbo pump) may be enabled to continuously remove some of gas 338 molecules and maintain the vacuum level during wafer conditioning process.

Figure 3B:
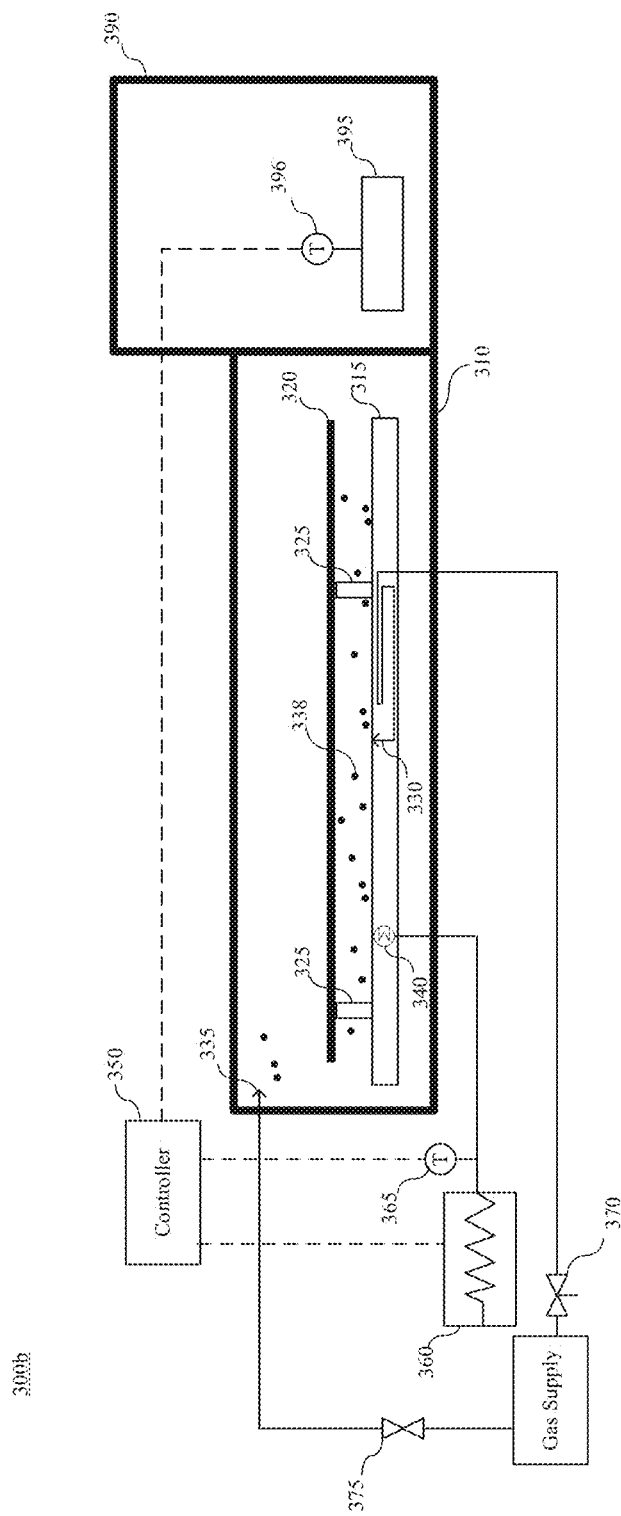
Figure 3C:
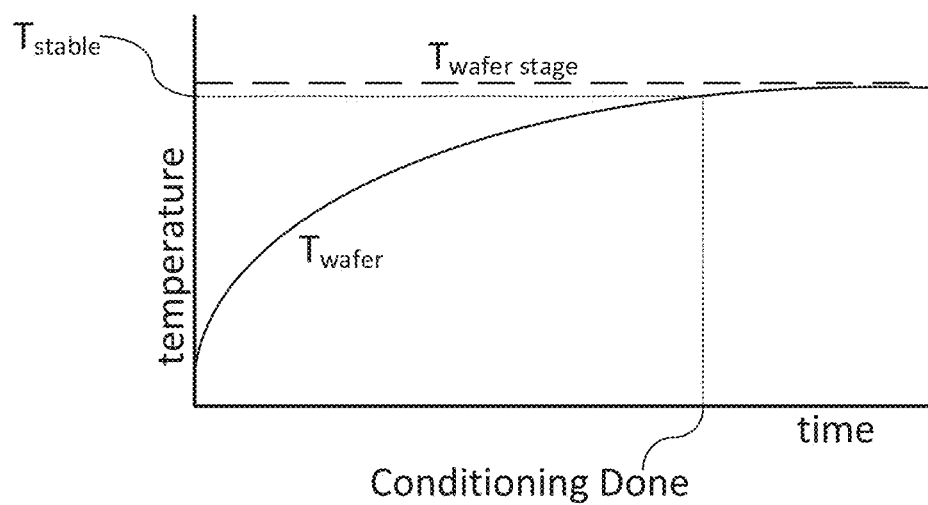
FIG. 3C is an exemplary graph showing a wafer temperature change over time during wafer temperature conditioning in a load lock system, consistent with embodiments of the present disclosure.
Figure 3D:
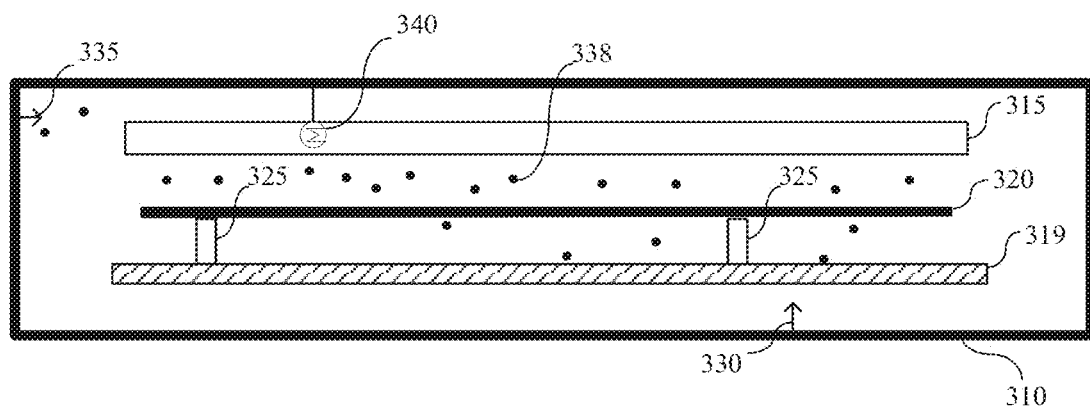
FIGS. 3D and 3E are schematic diagrams illustrating exemplary load lock systems, consistent with embodiments of the present disclosure.
Figure 3E:
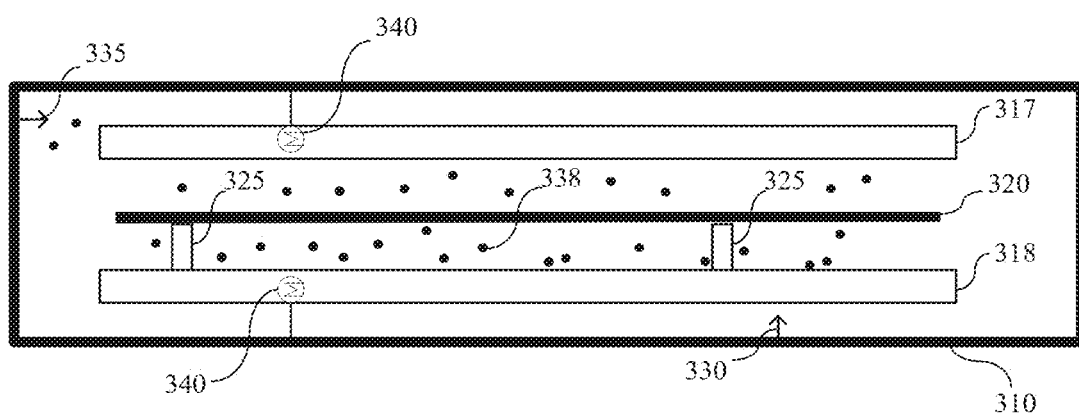
Figure 3F:
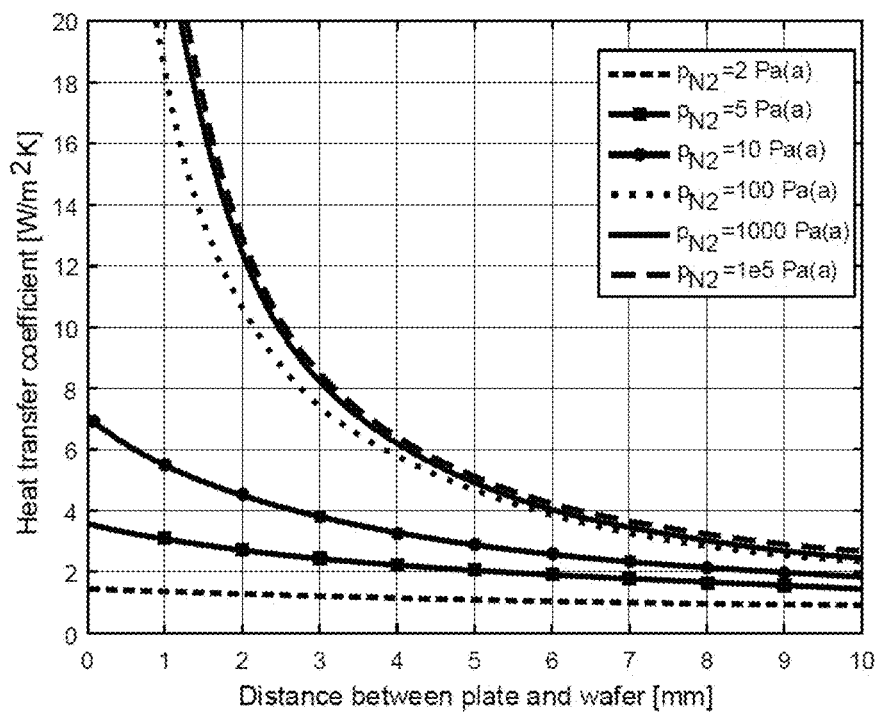
FIG. 3F is an exemplary graph showing a change in the efficiency of heat transfer relative to the gas pressure level in a load lock system, consistent with embodiments of the present disclosure.

As shown in FIG. 3F, the efficiency of the heat transfer increases when the gas pressure increases. However, the efficiency may not improve much more when the gas pressure approaches to a certain level, for example 100 Pa or above in FIG. 3F. Therefore, in some embodiments, the gas pressure in the space between wafer 320 and conditioning plate 315 may be in a range of 50 Pa to 5,000 Pa during conditioning of wafer 320 to provide an efficient heat transfer while keeping the gas pressure level sufficiently low. In some embodiments, the gas pressure may be in a range of 100 Pa to 1,000 Pa during conditioning of wafer 320 to provide a balance between the heat transfer efficiency while keeping the gas pressure close to vacuum.

In some embodiments, gas 338 may be temperature conditioned so that the gas molecules themselves may provide heat transfer to wafer 320. For example, the gas supply, gas valves 370 and 375, or any other part of load lock system 300a may include a heater to precondition the temperature of gas 338 before providing gas 338 into chamber 310.

In some embodiments, one or more gas vents 330 and 335 may be included in load lock chamber 310 as shown in FIG. 3A. In other embodiments, such as load lock system 300b shown in FIG. 3B, at least one of gas vents (e.g. gas vent 330 in FIG. 3B) may be included in conditioning plate 315 and provide gas 338 directly into the space between wafer 320 and conditioning plate 315. For example, in such embodiments, gas vent 330 may be included in conditioning plate 315 and located at or near to the center of wafer 320. It is appreciated that gas vents may be located at any other places as long as the vents are suitable for providing gas 338 into the space between wafer 320 and conditioning plate 315 in load lock chamber 310. It is also appreciated that load lock system 300a and 300b may include any number of gas vents.

In some embodiments, controller 350 may be configured to adjust gas vents 330 or 335 to change the gas flow rate into load lock chamber 310.

FIG. 3C shows an exemplary graph showing a wafer temperature change over time during wafer temperature conditioning in a load lock system. As the heat is transferred to the wafer, the temperature of wafer ($T_{wafer}$) gradually approaches the temperature of wafer stage ($T_{wafer\ stage}$). The conditioning process may be completed when the wafer temperature reaches a stable temperature ($T_{stable}$). In some embodiments, $T_{stable}$ may be the same as the temperature of wafer stage. In other embodiments, $T_{stable}$ may be set to a point approximately 100 mK lower than the wafer stage temperature ($T_{wafer\ stage}$-100 mK) to provide efficient throughput improvement. In some embodiments, $T_{stable}$ may be a setpoint at approximately 22° C. In other examples, $T_{stable}$ may be a setpoint within a range of 20-28° C.

Figure 6A:
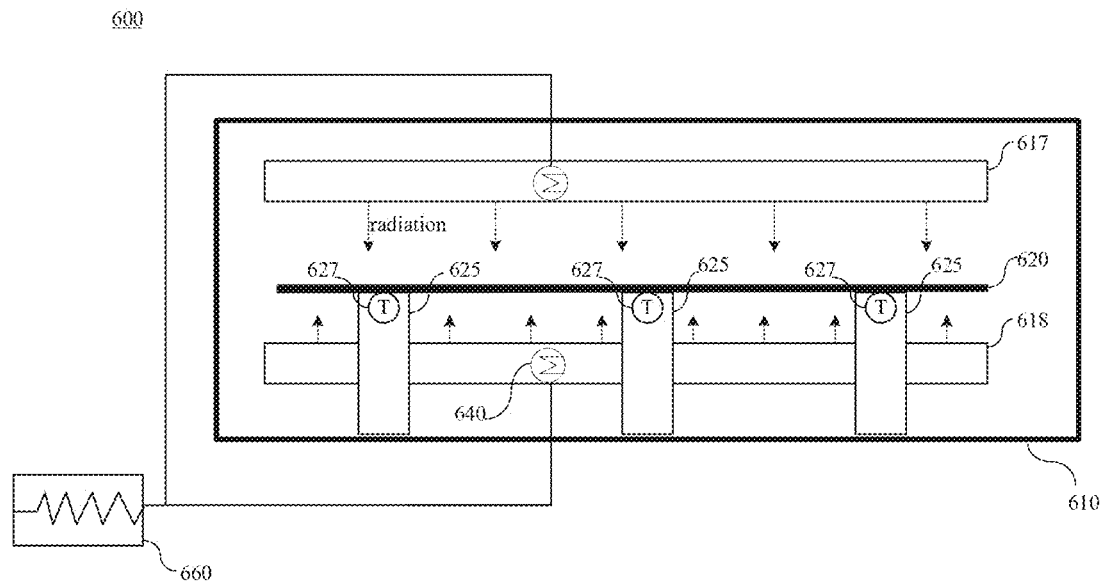
FIG. 6A is a schematic diagram illustrating an exemplary configuration of a wafer conditioning system, consistent with embodiments of the present disclosure.
Figure 6B:
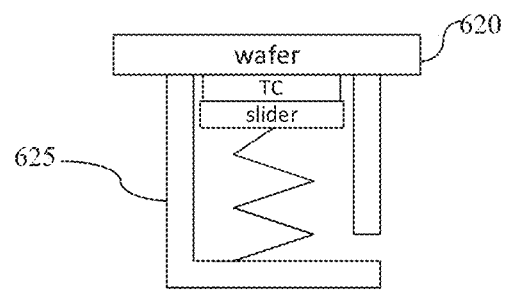
FIG. 6B is a schematic diagram illustrating an exemplary supporting structure of the wafer conditioning system of FIG. 6A, consistent with embodiments of the present disclosure.
Figure 6C:
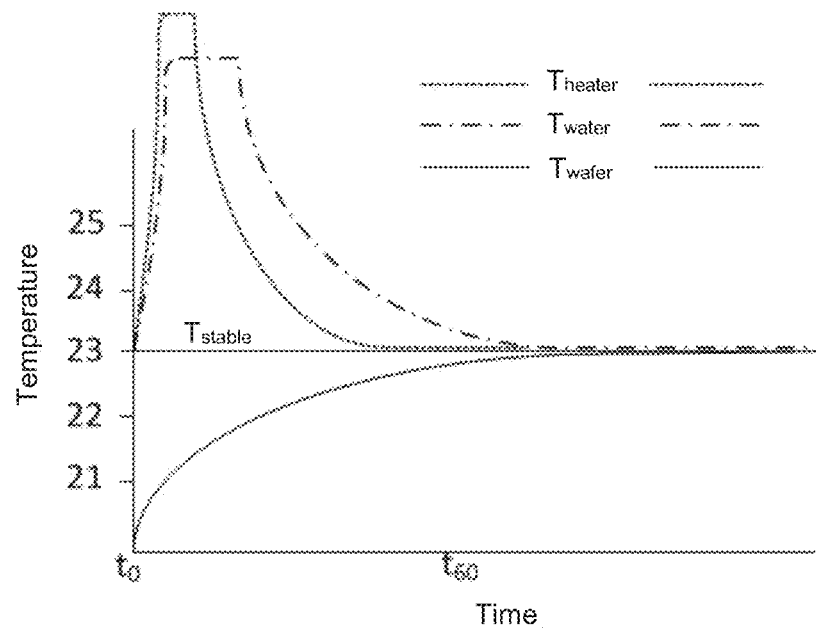
FIG. 6C is an exemplary graph illustrating temperature changes during conditioning process in a wafer conditioning system, consistent with embodiments of the present disclosure.

In some embodiments, as illustrated in FIG. 6C, when $T_{wafer}$ approaches near to $T_{stable}$, a controller (such as controller 350 in FIG. 3A) may adjust a heater (such as heater/cooler 360 in FIG. 3A) such that the conditioning plate temperature may be gradually reduced to prevent an overshoot of the wafer temperature.

After wafer 320 has reached $T_{stable}$, the conditioning step is finished, and thereafter the gas flow through gas vents (such as gas vents 330 and 335 in FIG. 3A) may be stopped. In some embodiments, after stopping the gas flow, the load lock vacuum pump may continue to run until the pressure in the load lock chamber (such as load lock chamber 310 in FIG. 3A) becomes at or near the pressure in the main chamber (such as main chamber 390 in FIG. 3A). Because the pressure inside the load lock chamber may have already been maintained close to a vacuum (e.g. 10-10,000 Pa), the pressure difference between the load lock chamber and the main chamber may be relatively small. In some embodiments, the heater (such as heater/cooler 360 in FIG. 3A) may maintain the temperature of conditioning plate such that the residual radiation from the conditioning plate may help to keep the temperature of wafer during the pump down.

When the gas pressure in the load lock chamber reaches at or near the pressure in the main chamber, in some embodiments, the wafer may be transported to the wafer stage (such as wafer stage 395 in FIG. 3A) for inspection. Because the temperature of the wafer may be at or near the temperature of the wafer stage, the inspection can begin with a minimal wait period. In other embodiments, the wafer may be transported to a parking station (such as parking station 70 of FIG. 1B) and be temporarily stored until the on-going inspection of the previous wafer is completed.

Reference is now made to FIG. 3D, which shows another exemplary load lock system 300d, consistent with embodiments of the present disclosure. In some embodiments, load lock system 300d may include a plurality of supporting structures 325 and a conditioning plate 315 configured to transfer heat to wafer 320. In some embodiments, conditioning plate 315 may include a heat transfer element 340.

In some embodiments, as illustrated in FIG. 3D, conditioning plate 315 may be positioned above wafer 320. In such embodiments, wafer 320 is supported by supporting structures 325 coupled to a supporting plate 319. While it is appreciated that more efficient heat transfer may be achieved as wafer 320 is positioned closer to conditioning plate 315, in some embodiments, it may be desirable to have sufficient distance in between wafer 320 and conditioning plate 315 to provide space for a robot arm to lift or transport wafer 320. In the configuration shown in FIG. 3D, however, because conditioning plate 315 is positioned above wafer 320, conditioning plate 315 may be placed much closer to wafer 320. In some embodiments, the distance may be reduced to approximately 1 mm between wafer 320 and conditioning plate 315.

In some embodiments, load lock system 300d may include gas vents 330 and 335 to provide gas 338 to the space between wafer 320 and conditioning plate 315. In some embodiments, at least one gas vent may be included in conditioning plate 315 to provide gas 338 to the space. It is appreciated that gas vents 330 or 335 may be located at other place of load lock system 300d as long as those places are suitable for providing gas 338 into the space between wafer 320 and conditioning plate 315 in load lock chamber 310. It is also appreciated that load lock system 300d may include any number of gas vents.

Reference is now made to FIG. 3E, which shows another exemplary load lock system 300e, consistent with embodiments of the present disclosure. Load lock system 300e may include a plurality of conditioning plates configured to transfer heat to wafer 320 from multiple directions. For example, load lock system 300e may include an upper conditioning plate 317 configured to transfer heat in a downward direction and a lower conditioning plate 318 configured to transfer heat in an upward direction. In some embodiments, upper conditioning plate 317 may include a heat transfer element 340. In some embodiment, lower conditioning plate may include a heat transfer element 340. Lower conditioning plate 318 may be coupled to supporting structures 325 configured to support wafer 320. Load lock system 300e may include gas vents 330 and 335 to provide gas 338 to a space between wafer 320 and conditioning plates 317 and 318. In some embodiments, at least one gas vent may be included in upper conditioning plate 317. In some embodiments, at least one gas vent may be included in lower conditioning plate 318.

Figure 4:
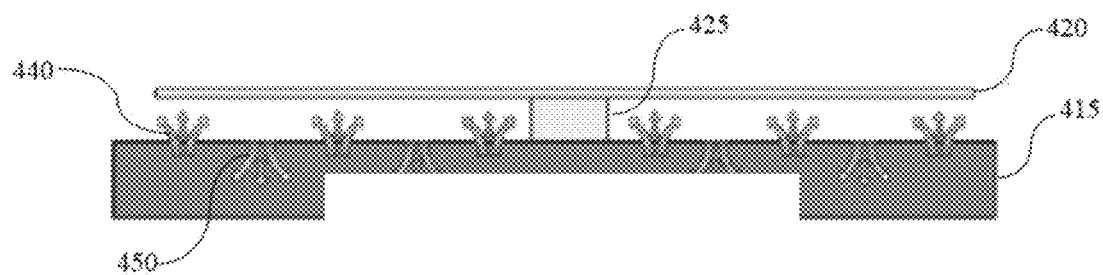
FIG. 4 is a schematic diagram of an exemplary pre-aligner in an equipment front end module (EFEM), consistent with embodiments of the present disclosure.

Reference is now made to FIG. 4, which is a schematic diagram of an exemplary pre-aligner in an equipment front end module (EFEM), consistent with embodiments of the present disclosure. In some embodiments, pre-aligner may include one or more supporting structures 425 configured to support a wafer 420 and conditioning plate 415 configured to transfer heat via heated compressed air from one or more air vents 440. In some embodiments, conditioning plate 415 further comprises one or more vacuum channel 450 configured to remove air. In such embodiments, heat transfer between wafer 420 and conditioning plate 415 may be created mainly by convection via temperature conditioned compressed air provided via one or more air vents 440. Because wafer conditioning is performed through forced convection of the temperature conditioned compressed air, the heat is transferred to or from wafer 420 efficiently, and therefore the wafer temperature may stabilize quickly to a stable temperature.

Figure 5:
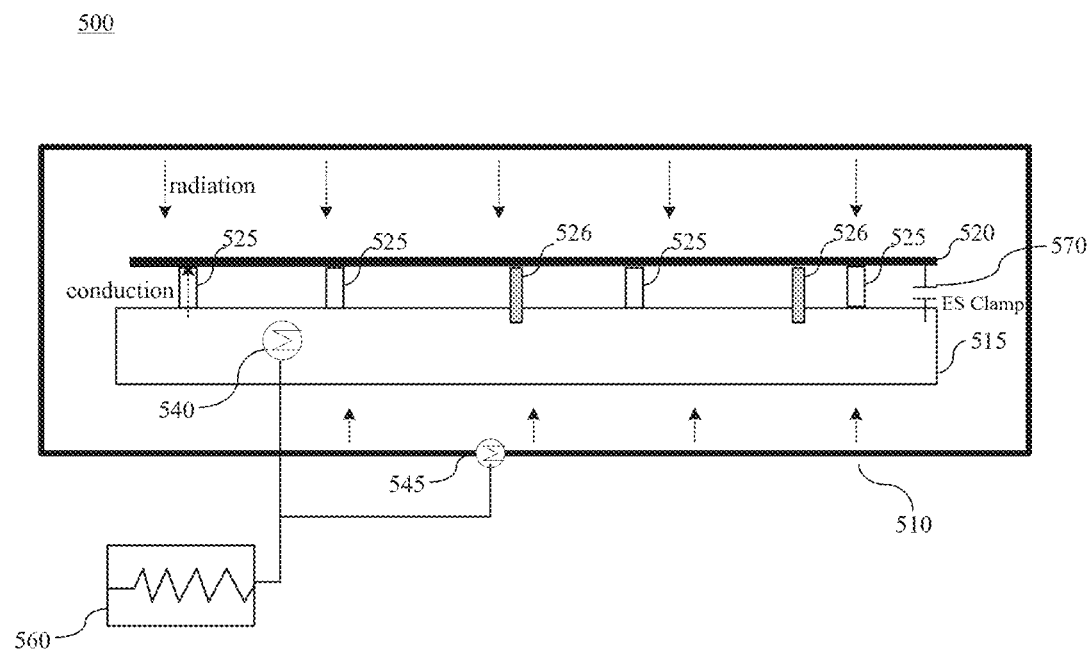
FIG. 5 is a schematic diagram illustrating an exemplary configuration of a wafer conditioning system, consistent with embodiments of the present disclosure.

Reference is now made to FIG. 5, which shows a schematic diagram illustrating an exemplary configuration of a wafer conditioning system 500, consistent with embodiments of the present disclosure. In some embodiments, wafer conditioning system 500 may include a plurality of supporting structures 525 and a conditioning plate 515 configured to transfer heat to wafer 520. Supporting structures 525, coupled to conditioning plate 515, may support wafer 520 and conduct heat to wafer 520. It is appreciated that supporting structures 525 may be in any shape suitable to support and conduct heat. In some embodiments, conditioning plate 515 may include a heat transfer element 540 configured to change the temperature of conditioning plate 515, which in turn affects the temperature of wafer 520. Heat transfer element 540 may be coupled to a heater 560. In some embodiments, heater 560 may be placed outside of a vacuum chamber 510. In other embodiments, heater 560 may be placed inside of vacuum chamber 510.

In some embodiments, conditioning plate 515 may further include an electrostatic clamp 570. Electrostatic clamp 570 may hold wafer 520 to conditioning plate 515 via an electric charge. A power source (not shown) provides the electric charge connecting wafer 520 to electrostatic clamp 570. For example, electrostatic clamp 570 may be part of or comprised in the conditioning plate 515. In other examples, electrostatic clamp 570 may be separate to conditioning plate 515. In some embodiments, conditioning plate 515 may include lifting structures 526 configured to lift wafer 520 to accommodate robot arms (not shown) for transporting wafer 520.

In some embodiments, vacuum chamber 510 may include a heat transfer element 545 configured to change the temperature of vacuum chamber 510. In such embodiments, heat may be transferred from internal surfaces of vacuum chamber 510 to wafer 520 via radiation (as illustrated in FIG. 5). Vacuum chamber 510 may be a load lock chamber 20 of FIG. 1, part of parking station 70 of FIG. 1B, or main chamber 10 of FIG. 1B.

Reference is now made to FIG. 6A, which shows a schematic diagram illustrating another exemplary configuration of a wafer conditioning system 600, consistent with embodiments of the disclosure. System 600 may include a vacuum chamber 610 and one or more supporting structures 625 configured to support a wafer 620. In some embodiments, wafer conditioning system 600 may include one or more of heating devices configured to transfer heat to wafer 620 via radiation from multiple directions. For example, as shown in FIG. 6A, system 600 may include upper heating device 617 and lower heating device 618.

In some embodiments, heating device 617 or 618 may be a conditioning plate, one or more tubes, or one or more coils configured to radiate heat to wafer 620. In some embodiments, system 600 may include a single heating device, which may be positioned above or below wafer 620. In some embodiments, system 600 may include upper heating device 617 and lower heating device 618 positioned relative to wafer 620. In some embodiments, system 600 may include three or more heating devices. In some embodiments, system 600 may include a heater 660 configured to provide heat to heating device 617 or 618. Heater 660, in some embodiments, may be a water heater or any other type of heater that can provide heat to heating devices 617 or 618.

In some embodiments, supporting structure 625 may include a temperature sensor 627 configured to measure the temperature of wafer 620. Temperature sensor 627 may comprise a thermocouple (TC), an NTC thermistor, a PTC thermistor, resistance thermometer, an infrared thermometer, or any other devices suitable for measuring the temperature of wafer 620. For example, as shown in FIG. 6B, supporting structure 625 may include a thermocouple configured to measure a temperature of wafer 620. To enable measuring the temperature of wafer, supporting structure 625 may include a spring-like structure to push the thermocouple to come into contact with wafer 620. In some embodiments, the thermocouple and the spring-like structure may be enclosed by supporting structure 625.

Since system 600 operates in vacuum chamber 610, the heat transfer from wafer to the thermocouple, for measurement of wafer temperature, may be via conduction and radiation. For some embodiments, to measure the temperature of wafer 620 more accurately, it may be desired to minimize the heat radiation to the thermocouple. Accordingly, the surfaces of the thermocouple, except for the surface contacting wafer 620, may be covered by one or more structures made of a material that does not transmit heat, such that the thermocouple may receive heat via conduction from wafer 620. In some embodiments, supporting structure 625 may be made of the material preventing heat transfer. In some embodiments, system 600 may include multiple thermocouples to collect temperature information from multiple parts of wafer 620. In such embodiments, a controller (such as controller 650 shown in FIG. 6E) may determine the temperature distribution characteristics of wafer 620.

Reference is now made to FIG. 6C, which is an exemplary graph illustrating temperature changes during the conditioning process. A wafer conditioning system may include a control mechanism to change the temperature of heating devices on the fly while wafer conditioning is in progress. Furthermore, in some embodiments, the wafer conditioning system may include one or more temperature sensors configured to measure temperatures of various part of the system. In some embodiments, the wafer conditioning system may include one or more temperature sensors configured to measure the temperature of the wafer itself. FIG. 6C illustrates the temperature change over time in an example of such embodiments. In such embodiments, it is possible to start the conditioning process with high temperatures of heating devices (even higher than the desired stable temperature, $T_{stable}$), and then bring the temperatures down gradually to the desired stable temperature as $T_{wafer}$ approaches $T_{stable}$. In some embodiments, this process may be further optimized by the temperature information from the sensors. As shown in FIG. 6C, controlling the temperature in such way may reduce the conditioning time significantly.

Figure 6D:
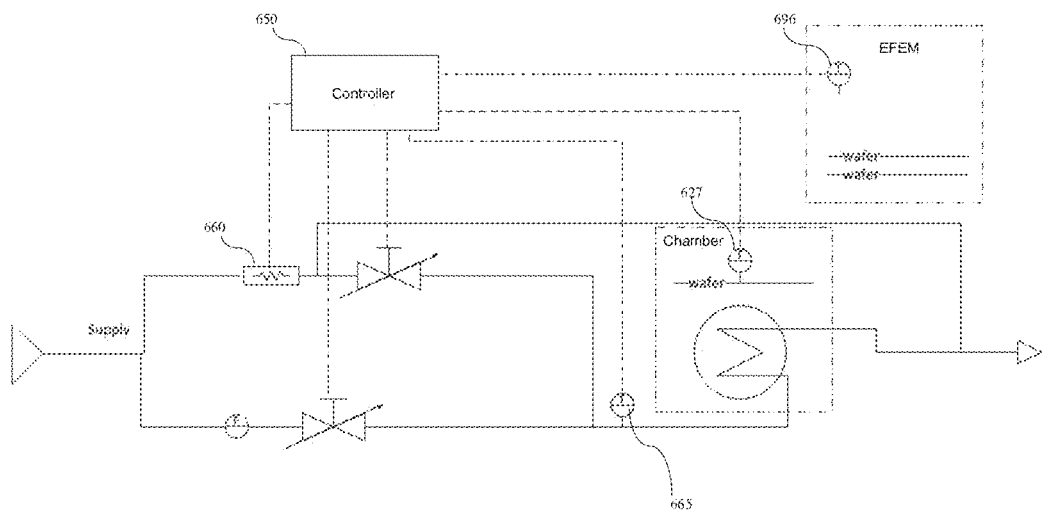
FIG. 6D is a schematic diagram illustrating an exemplary control circuit of a wafer conditioning system, consistent with embodiments of the present disclosure.

Reference is now made to FIG. 6D, which is a schematic diagram illustrating an exemplary control circuit of a wafer conditioning system, consistent with embodiments of the present disclosure. In some embodiments, a wafer conditioning system, such as system 600 in FIG. 6A, may include a controller and one or more of temperature sensors configured to measure various parts of the system. In some embodiments, the wafer conditioning system may include one or more temperature sensors configured to measure the temperature of wafer. For example, controller 650 may receive temperature data about the temperature of incoming wafer from a temperature sensor 696 in an equipment front end module (such as EFEM 30 of FIG. 1A). Controller 650 may receive wafer temperature data about the temperature of wafer from temperature sensor 627. Controller 650 may receive heater temperature data about the temperature of the output of heater 660 (e.g. water at the output of a water heater) from temperature sensor 665. In some embodiments, controller 650 may control heater 660 based on the at least one of the temperature data from sensors 696, 627, and 665. For example, heater 660 may comprise an electric water heater configured to transfer heat to water. With the temperature feedback, controller 650 may adjust the electric current supplied to heater 660, thereby resulting in the change of the temperature of heat transfer elements (e.g. heating devices 617 or 618 in FIG. 6A). In some embodiments, controller 650 may be calibrated based on the types or conditions of wafer.

Even if the control mechanism is described in context of system 600 of FIG. 6A to explain the functionality, it is appreciated that the same control mechanism may be applied to any of the embodiments of wafer conditioning system shown in this disclosure.

Figure 7:
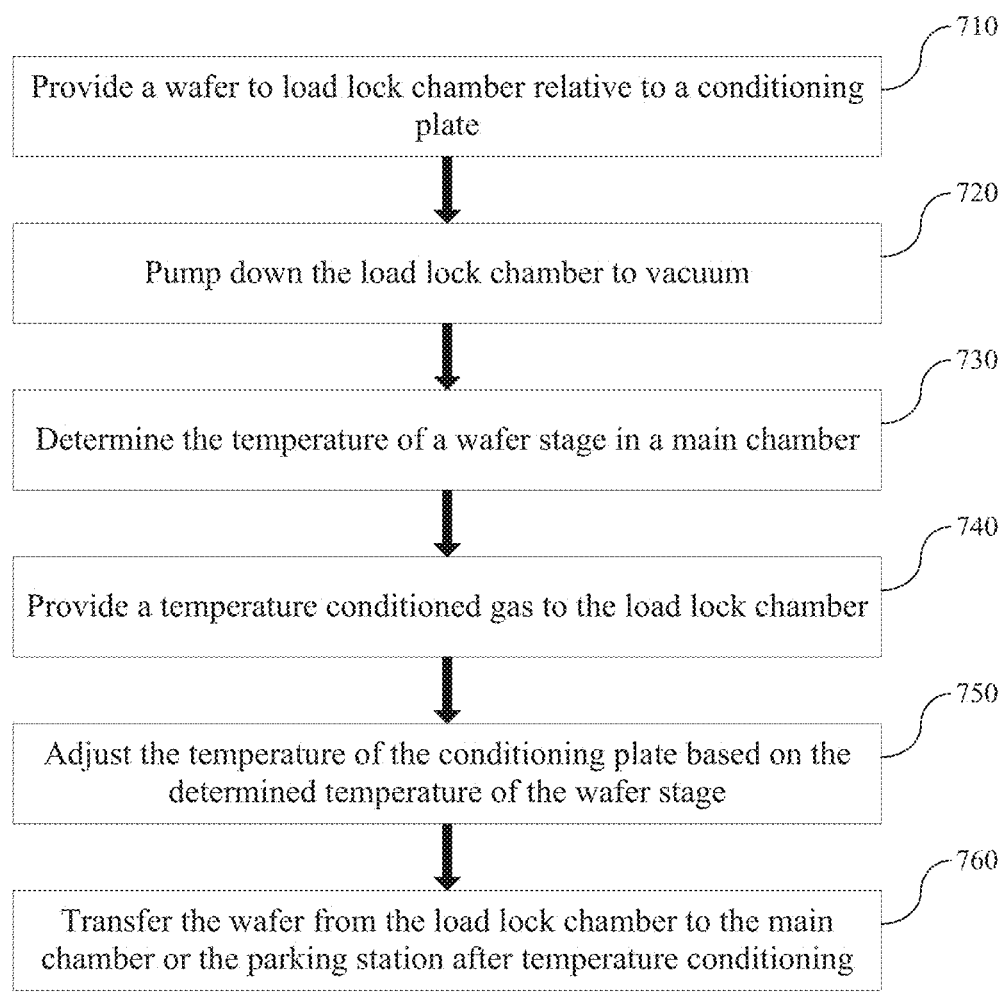
FIG. 7 is a flow chart illustrating an exemplary method for conditioning a wafer temperature, consistent with embodiments of the present disclosure.

Reference is now made to FIG. 7, which is a flow chart illustrating an exemplary method for conditioning a wafer temperature, consistent with embodiments of the present disclosure. The method may be performed by a load lock system (e.g., load lock systems 300*a*, 300*b*, 300*d*, and 300*e* of FIGS. 3A-3D) of an e-beam system (e.g., charged particle beam inspection system 100 of FIG. 1A).

In step 710, a wafer is loaded by a robot arm into a load lock chamber relative to a conditioning plate. In some embodiments, the wafer may be placed above the conditioning plate. In other embodiments, the wafer may be placed below the conditioning plate. In some embodiments, the wafer may be placed between two conditioning plates.

In step 720, after the wafer is loaded into a load lock chamber (e.g., load lock chamber 20 in FIG. 1A), a controller (e.g, controller 50 of FIG. 1A) enables a vacuum pump to remove air from the load lock chamber.

In step 730, the temperature of wafer stage (e.g. wafer stage 395 of FIG. 3A) is determined and provided to the controller.

In step 740, a gas supply (e.g. gas supply in FIG. 3A) provides a gas to the load lock chamber for heat transfer between the conditioning plate and the wafer. The gas may be temperature conditioned to match the measured temperature of wafer stage to provide more efficient heat transfer.

In step 750, the controller receives the wafer stage temperature data and adjusts the heating temperature based on the determined temperature of the wafer stage.

In step 760, after the wafer conditioning is completed, the wafer conditioning system transfers the conditioned wafer from the load lock chamber to a main chamber (e.g. main chamber 390 in FIG. 3A) or a parking station (e.g. parking station 70 in FIG. 3B). In some embodiments, if a temperature sensor is present to measure the temperature of wafer, the controller may monitor the wafer temperature and determine whether the wafer conditioning is completed.

It is appreciated that a controller of the wafer conditioning system could use software to control the functionality described above. For example, the controller may send instructions to the aforementioned heater to change the temperature of heat transfer elements. The controller may also send instructions to adjust input voltage or current to the heater. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

Figure 8A:
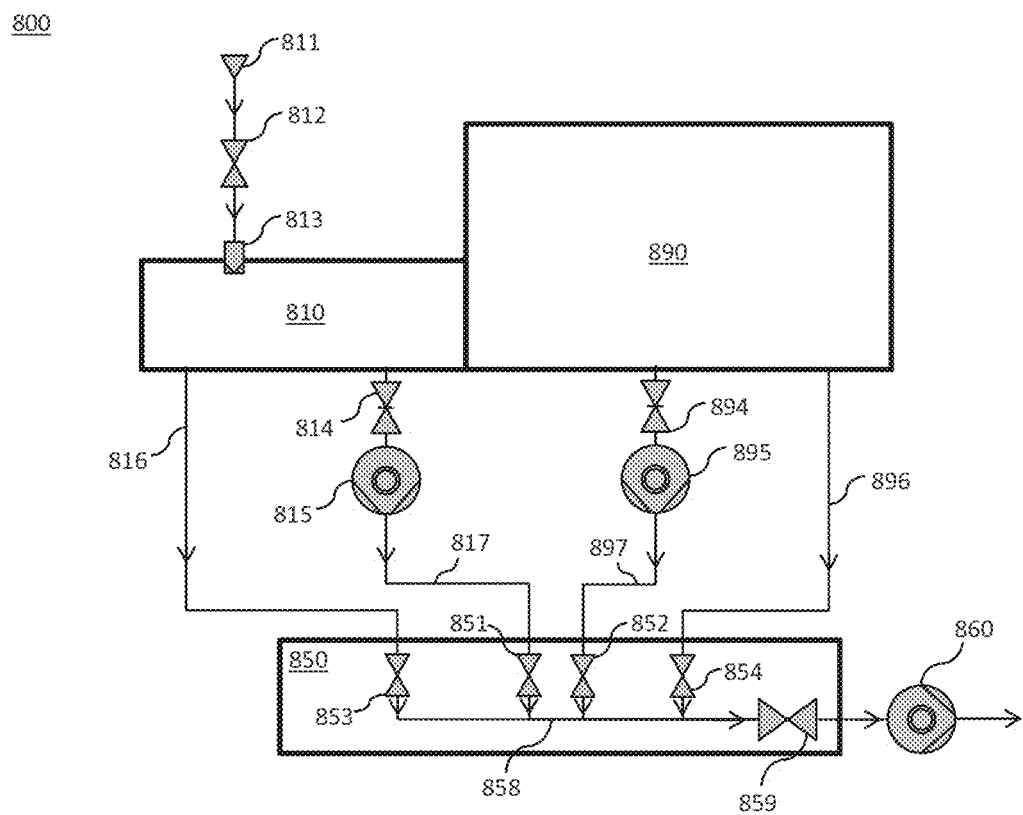
FIGS. 8A and 8B are schematic diagrams illustrating an exemplary charged particle beam inspection system with a vacuum pump system, consistent with embodiments of the present disclosure.
Figure 8B:
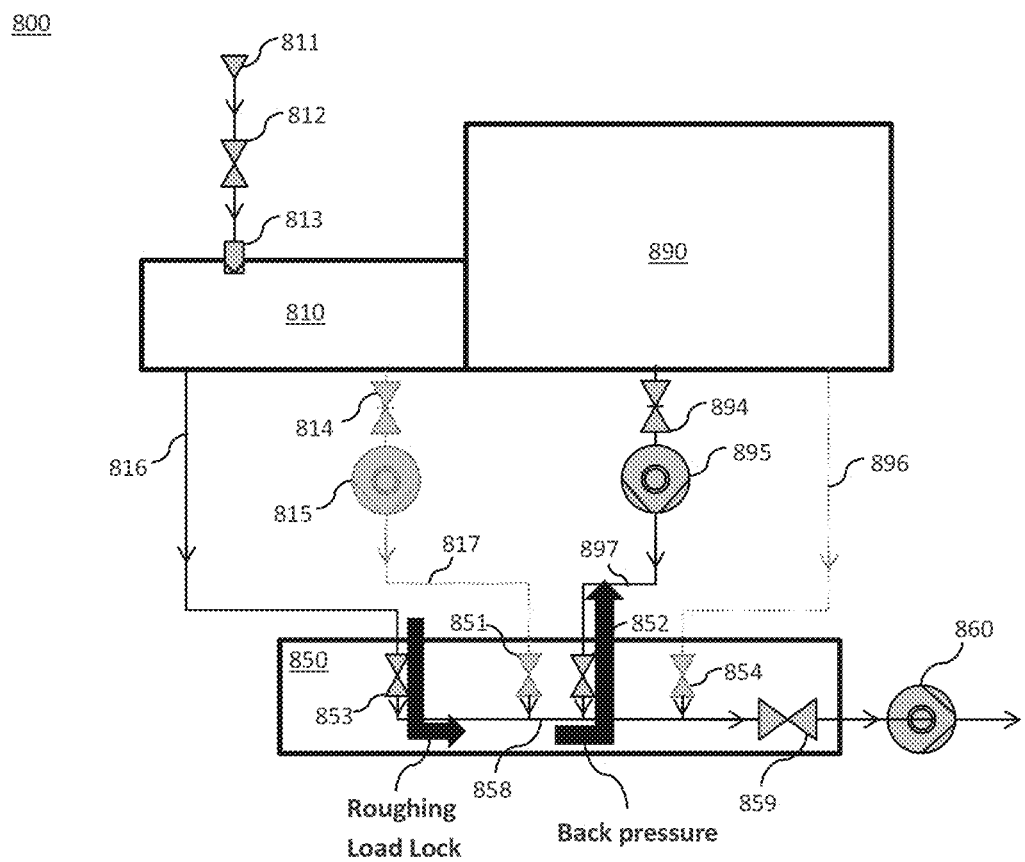

Reference is now made to FIGS. 8A and 8B, which show schematic diagrams illustrating an exemplary charged particle beam inspection system 800 with a vacuum pump system, consistent with embodiments of the present disclosure. In some embodiments, charged particle beam inspection system 800 may include a main chamber 890 and a load lock chamber 810. In some embodiments, system 800 may include a gas supply 811, gas vent valve 812, and gas vent diffuser 813 that is connected to load lock chamber 810. Gas supply 811 may provide a gas (e.g., gas 338 in FIG. 3A) into load lock chamber 810 during wafer conditioning process to increase thermal conductivity between a wafer (e.g., wafer 320 of FIG. 3A) and a conditioning plate (e.g., conditioning plate 315 of FIG. 3A). The gas may be nitrogen, helium, hydrogen, argon, CO2, or compressed dry air. It is appreciated that the gas may be any other gas suitable for heat transfer.

In some embodiments, the vacuuming of load lock chamber 810 may be performed over two stages via two separate paths. This first path is called a roughing path and may comprise a load lock roughing line 816 and a load lock roughing valve 853. During the roughing stage, load lock chamber 810 is pumped down from the atmospheric condition to a "rough" vacuum level (e.g., $5\times10^{-1}$ Torr). In the first stage, load lock roughing valve 853 is opened to initially pump down load lock chamber 810 via load lock roughing line 816 while the other path is closed.

The second path is called a turbo pumping path and may comprise a load lock turbo valve 814, a load lock turbo pump 815, a load lock turbo pumping line 817, and a load lock turbo pump backing valve 851. After the roughing of load lock chamber 810 is completed, load lock turbo pump 815 takes over to pump out load lock chamber 810 to a deeper vacuum level (e.g., lower than $1.5\times10^{-6}$ Torr). In this second stage, load lock roughing valve 853 is first closed. Then load lock turbo valve 814 and load lock turbo pump backing valve 851 are opened, so that load lock turbo pump 815 pumps down load lock chamber 810.

Main chamber 890 may be vacuumed in a similar way. First, main chamber 890 is pumped down from the atmospheric condition to a "rough" vacuum level (e.g., $5\times10^{-1}$ Torr) via a main chamber roughing path (comprising a main chamber roughing line 896 and a main chamber roughing valve 854). After roughing stage is completed, a main chamber turbo pump 895 takes over to pump further down to a deeper vacuum level (e.g., lower than $1.5\times10^{-6}$ Torr) via a main chamber turbo pumping path (comprising a main chamber turbo valve 894, a main chamber turbo pump 895, a main chamber turbo pumping line 897, and a main chamber turbo pump backing valve 852). In some embodiments, main chamber turbo pump 895 may continue to run until the wafer inspection is completed.

While FIG. 8A shows system 800 having one roughing path and one turbo pumping path for load lock chamber 810, it is appreciated that the system may utilize any number of roughing paths and turbo pumping paths to vacuum load lock chamber 810. For example, system 800 may have two or more roughing paths parallelly connected to load lock chamber 810. Independent from the number of roughing paths, system 800 may have two or more turbo pumps parallelly connected to load lock chamber 810. Similarly, it is appreciated that the system may utilize any number of roughing path and turbo pumping path to pump down main chamber 890.

In some embodiments, system 800 may include a central manifold box 850 in which all roughing lines (e.g., load lock roughing line 816 and main chamber roughing line 896) and all pumping lines (e.g., load lock turbo pumping line 817 and main chamber turbo pumping line 897) are merged. Central manifold box 850 may house a number of valves to control the vacuuming process. For example, central manifold box 850 may include load lock roughing valve 853, main chamber roughing valve 854, load lock turbo pump backing valve 851, and main chamber turbo pump backing valve 852. After these individual valves, all lines are merged to a foreline 858. The final exhaustion through a dry vacuum pump 860 is controlled by a foreline valve 859 that may be located before dry vacuum pump 860.

As described in the previous sections with respect to FIG. 3A, in some embodiments, during the wafer temperature conditioning process, load lock chamber 810 may be continuously pumped down via roughing line 816 or turbo pump 815 to continuously remove some of the gas molecules (e.g., gas 338 of FIG. 3A) and maintain the vacuum level of load lock chamber 810 until the wafer conditioning is completed.

As illustrated in FIG. 8B, in some embodiments, this continuous pumping down of load lock chamber 810 may introduce a temporary pressure jump in the shared foreline (e.g., foreline 858), thereby causing the inspection process in main chamber 890 to be interrupted. For example, as explained in the previous sections, the wafer temperature conditioning process may be performed in load lock chamber 810 at the same time a previous wafer is being inspected in main chamber 890. When load lock roughing valve 853 is opened to begin the continuous pumping down process, however, the pressure within foreline 858 may increase because the high-pressure condition in load lock chamber 810 is exposed to foreline 858 due to the open connection established through load lock roughing line 816. The increased pressure in foreline 858 may create higher back pressure to main chamber turbo pump 895. Because main chamber turbo pump 895, in some embodiments, may be concurrently running to maintain low pressure level in main chamber during the inspection of the previous wafer when the wafer temperature conditioning is performed in load lock chamber 810, the sudden increase of back pressure may influence the dynamic behavior of turbo pump 895. As a result, a sudden vibration on system 800 may occur. This sudden vibration may cause an inspection error. Therefore, if the vibration level is higher than a margin for the inspection error, the inspection process may need to be paused until the back pressure disappears and the vibration is damped. This interruption of the inspection process may hurt the system throughput. The increased back pressure may also cause the effective pumping speed of turbo pump 895 decreased, thereby increasing the pressure in main chamber 890 temporarily. This temporary increase of main chamber pressure may also impact the system throughput and the overall system performance. The effects are explained in more details in the next section with respect to FIG. 9.

Figure 9:
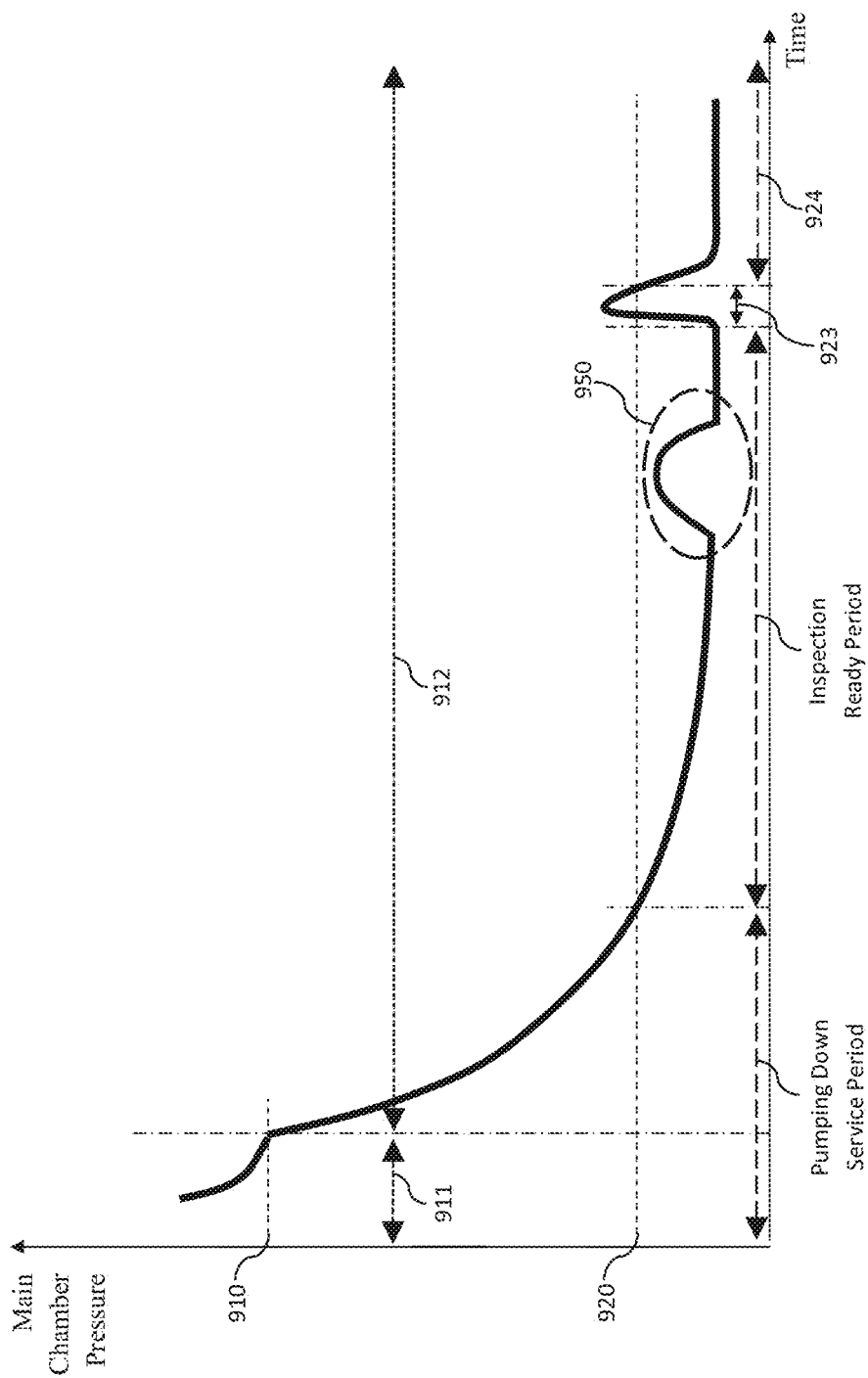
FIG. 9 is an exemplary graph illustrating a pressure change in a main chamber of a charged particle beam inspection system, consistent with embodiments of the present disclosure.

Reference is now made to FIG. 9, which an exemplary graph illustrating a pressure change in a main chamber (e.g., main chamber 890 of FIGS. 8A and 8B) of a charged particle beam inspection system (e.g., charged particle beam inspection system 800 of FIGS. 8A and 8B). As explained above with respect to FIG. 8A, the main chamber is pumped down over two stages, which are roughing stage 911 and turbo pumping down stage 912. During roughing stage 911, the main chamber is pumped down from the atmospheric condition to a "rough" vacuum level 910 (e.g., $5\times10^{-1}$ Torr) via the roughing path. After the main chamber pressure reaches "rough" vacuum level 910, a roughing valve (e.g., main chamber roughing valve 854 of FIG. 8A) is closed and a main chamber turbo pump (e.g., main chamber turbo pump 895) takes over to bring the main chamber pressure further down to a deeper vacuum level. When the main chamber pressure becomes lower than an "inspection ready" vacuum level 920 (e.g., $1.5\times10^{-6}$ Torr), the wafer inspection process may begin. In some embodiments, main chamber turbo pump 895 may continue to run to maintain main chamber pressure level close to "inspection ready" level 920.

When the inspection of a first wafer is completed, in some embodiments, the wafer exchange may occur in a period 923. During wafer exchange, the main chamber pressure may increase temporarily because the gate valve (e.g., gate valve 26 of FIG. 1B) between a load lock chamber (e.g., load lock chamber 810 of FIG. 8A) and the main chamber (e.g., main chamber 890 of FIG. 8A) is opened. After the wafer exchange, the inspection process may begin again once the main chamber turbo pump brings the main chamber pressure back down to "inspection ready" vacuum level 920.

Before the wafer exchange, while the first wafer is being inspected in the main chamber, the second wafer may go through the wafer temperature conditioning process, and as explained above, the main chamber pressure may temporarily increase due to the back pressures applied to the main chamber turbo pump. An example of the temporary pressure jump 950 is illustrated in the graph.

If the temporary pressure jump 950 is still below "inspection ready" vacuum level 920, the inspection of the first wafer may continue without an interruption as long as the vibration level stays within the margin of error. However, if the main chamber pressure increases higher than "inspection ready" vacuum level 920 during the temporary jump 950, the inspection of the first wafer may need to be paused until the main chamber pressure comes back down to "inspection ready" level. As a result, the system throughput may be impacted by this interruption.

Figure 10:
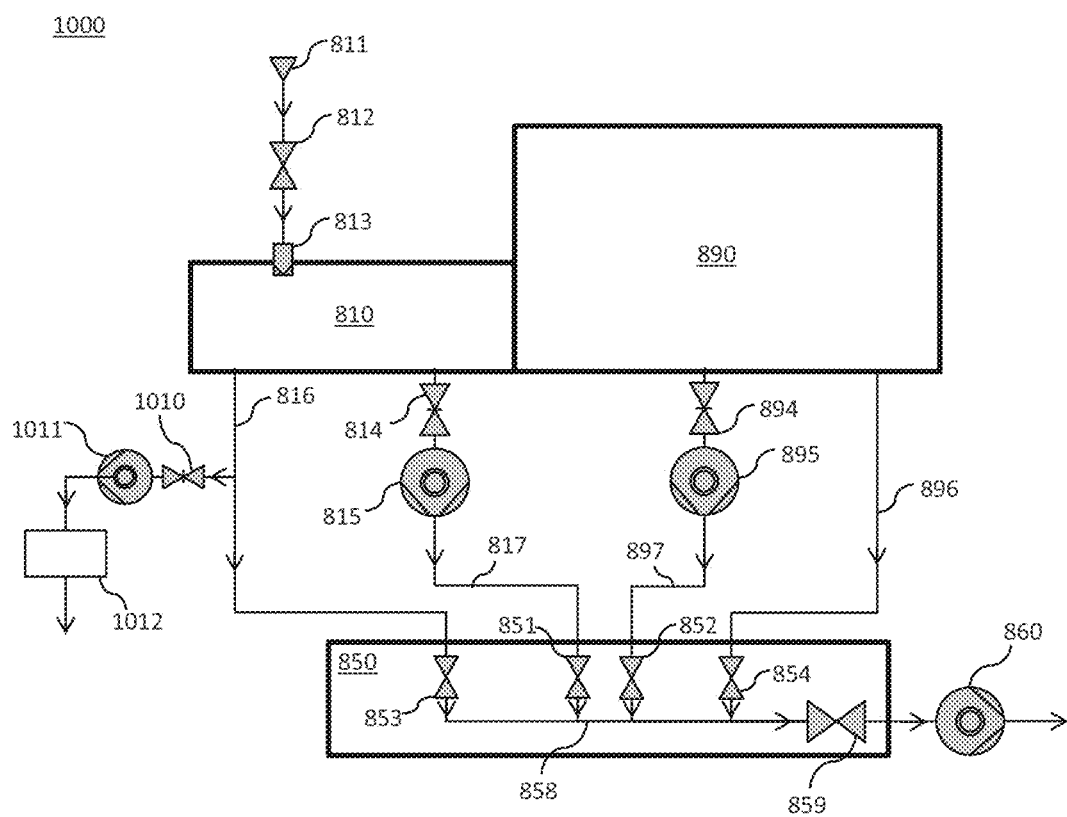
FIG. 10 is a schematic diagram illustrating an exemplary charged particle beam inspection system with a vacuum pump system, consistent with embodiments of the present disclosure.

Reference is now made to FIG. 10, which shows a schematic diagram illustrating an exemplary charged particle beam inspection system 1000 with an improved vacuum pump system, consistent with embodiments of the present disclosure. In some embodiments, a separate pumping path may be added to a load lock chamber 810 to prevent the vibration and the pressure jump in a main chamber 890. For example, in some embodiments, charged particle beam inspection system 1000 may include a load lock booster roughing valve 1010, a load lock booster roughing pump 1011, and an auxiliary exhaust system 1012. All other part of system 1000 are the same as system 800 of FIG. 8A.

In such embodiments, during the wafer temperature conditioning, load lock booster roughing pump 1011 may continuously run to remove the gas molecules (e.g., gas 338 of FIG. 3A). However, because load lock roughing valve 853 and load lock turbo pump backing valve 851 remain closed during this period, there is no pressure increase in foreline 858, hence no back pressure may be incurred on main chamber turbo pump 895.

Accordingly, in some embodiments, pumping down process for load lock chamber 810 may be broken down to three stages. First, load lock booster roughing pump 1011 may operate from the atmospheric condition (after receiving a new set of wafers from EFEM (e.g., EFEM 30 of FIG. 1A) to a vacuum level for wafer temperature conditioning. Second, the regular load lock roughing path (via load lock roughing line 816) may operate from the wafer temperature conditioning vacuum level to the "rough" vacuum level. Finally, load lock turbo pump 815 may operate from the "rough" vacuum level to the deeper vacuum level. The back pressure problem is the highest when foreline 858 is exposed to the viscous regime in the beginning of pumping near the atmospheric condition. As a result, after the load lock chamber pressure level is brought down to a wafer temperature conditioning vacuum level by the separate booster pump (e.g., load lock booster roughing pump 1011), the regular pumping mechanisms (e.g., load lock roughing line 816 or load lock turbo pump 815) can be used without creating too much back pressure.

Figure 11:
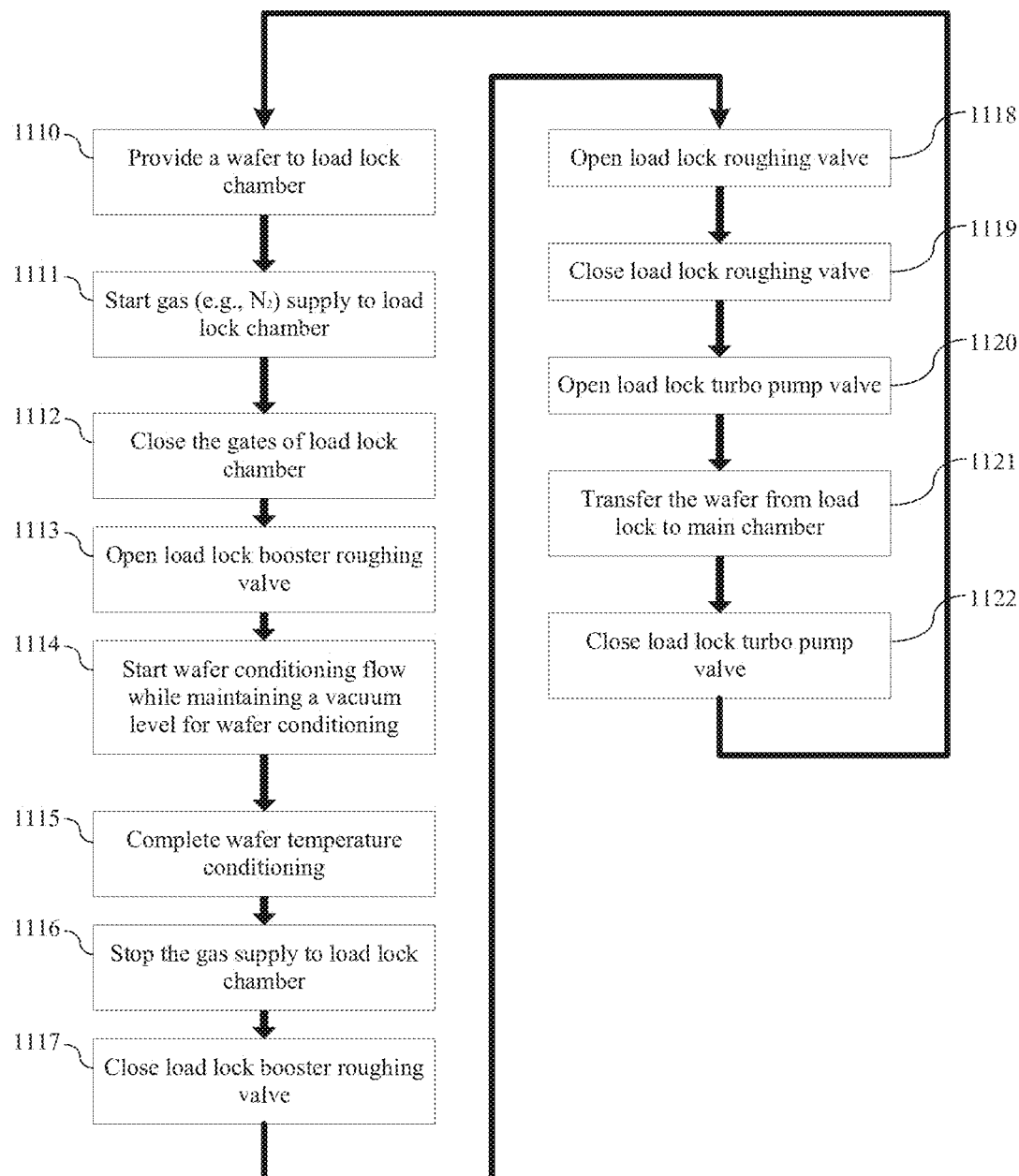
FIG. 11 is a flow chart illustrating an exemplary method for controlling vacuum level of a load lock chamber of the charged particle beam inspection system of FIG. 10, consistent with embodiments of the present disclosure.

Reference is now made to FIG. 11, which is a flow chart illustrating an exemplary method for controlling vacuum level of a load lock chamber of the charged particle beam inspection system of FIG. 10, consistent with embodiments of the present disclosure. The method may be performed by the charged particle beam inspection system of FIG. 10.

In step 1110, a wafer (or a plurality of wafers) is loaded by a robot arm (e.g., robot arm 11 of FIG. 1B) into a load lock chamber (e.g., load lock chamber 810 of FIG. 10).

In step 1111, a gas supply (e.g. gas supply 811 of FIG. 10) starts providing a gas (e.g., gas 338 of FIG. 3A) to the load lock chamber for the wafer temperature conditioning.

In step 1112, all gates (e.g., gate valve 25 and 26 of FIG. 1B) are closed in preparation of the vacuuming process. In some embodiments, step 1111 may occur after all gates are closed in step 1112.

In step 1113, a booster pump valve (e.g., load lock booster roughing valve 1010) is opened and a booster pump (e.g., load lock booster roughing pump 1011) starts pumping down the load lock chamber. As explained above with respect to FIG. 10, in this first stage, the load lock chamber is pumped down from the atmospheric condition to a vacuum level suitable for wafer temperature conditioning. Because the booster pumping line is connected to a separate exhaust system (e.g., auxiliary exhaust system 1012 of FIG. 10) and not merged with the regular roughing paths to form a shared foreline (e.g., foreline 858 of FIG. 10) in a manifold box (e.g., central manifold box 850 of FIG. 10), the booster pumping does not cause back pressure in the foreline. Therefore there may be no impact on the system throughput.

In step 1114, the wafer conditioning flow starts. This step may include adjusting the heating temperature of a conditioning plate (e.g., conditioning plate 315 of FIG. 3A) based on the determined temperature of the wafer stage (e.g., wafer stage 395 of FIG. 3A) in a main chamber (e.g., main chamber 890 of FIG. 10). While wafer temperature conditioning is performed, the booster pump continues to run to maintain the vacuum level suitable for wafer temperature conditioning. In step 1115, when the wafer temperature reaches a stable temperature (e.g., $T_{stable}$ in FIG. 3C, the conditioning process is completed.

In step 1116, after the wafer temperature conditioning is completed, a gas vent valve (e.g., gas vent valve 812 of FIG. 10) is closed and the gas supply is stopped. In step 1117, the first stage of pumping down process is completed and the booster valve (e.g., load lock booster roughing valve 1010) is closed.

In step 1118, the second stage of pumping down process begins by opening a load lock roughing valve (e.g., load lock roughing valve 853 of FIG. 10). During this second stage, the load lock chamber in some embodiments may be pumped down from the wafer conditioning vacuum level to a "rough" vacuum level (e.g., 5×10−1 Torr). After reaching the "rough" vacuum level, in step 1119, the load lock roughing valve is closed.

In step 1120, the third stage of pumping down process begins and a turbo pump (e.g., load lock turbo pump 815) takes over to pump out load lock chamber 810 to a deeper vacuum level close to the main chamber pressure.

In step 1121, after the wafer inspection for the previous wafer is completed, the previous wafer is removed from the main chamber and the temperature conditioned wafer is transferred from the load lock chamber to the main chamber. In step 1122, when the wafer exchange is completed, the load lock turbo pump valve is closed.

After step 1122, step 1110 can be performed to load a new set of wafers to the load lock chamber. If an unconditioned and uninspected wafer is still present in the load lock chamber, the system may proceed to step 1111 to condition another wafer in preparation of the inspection process.

It is appreciated that a controller of the wafer conditioning system could use software to control the functionality described above. For example, the controller may send instructions to the aforementioned valves and pumps to control the pumping down paths. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

The embodiments may further be described using the following clauses:

1. A load lock system, comprising:
    a plurality of supporting structures configured to support a wafer;
    a first conditioning plate including a first heat transfer element configured to adjust a temperature of the wafer;
    a first gas vent configured to provide a gas between the first conditioning plate and the wafer; and
    a controller including a processor and a memory, the controller configured to assist with control of the first heat transfer element.
2. The load lock system of clause 1, wherein the first conditioning plate is positioned above the wafer.
3. The load lock system of clause 1, wherein the first conditioning plate is positioned below the wafer.
4. The load lock system of clause 3, wherein the plurality of supporting structures are coupled to the first conditioning plate.
5. The load lock system of any one of clauses 1-4, wherein the first gas vent is attached to the first conditioning plate.
6. The load lock system of any one of clauses 1-5, wherein the controller is further configured to assist with the control of the first heat transfer element based on a temperature of a wafer stage.
7. The load lock system of any one of clauses 1-6, wherein the controller is further configured to control a rate of gas flow through the first gas vent.
8. The load lock system of any one of clause 1-7, further comprising a second conditioning plate including a second heat transfer element configured to adjust the temperature of the wafer.
9. The load lock system of clause 8, wherein the plurality of supporting structures configured to support a wafer are positioned between the first conditioning plate and the second conditioning plate.
10. The load lock system of clause 9, further comprising a second gas vent configured to provide a portion of the gas between the second conditioning plate and the wafer.
11. The load lock system of clause 10, wherein the second gas vent is coupled to the second conditioning plate.
12. The load lock system of any one of clauses 8-11, wherein the controller is further configured to assist with controlling the second heat transfer element based on a temperature of the wafer stage.
13. The load lock system of any one of clauses 10-12, wherein the controller is further configured to control a rate of gas flow through the second gas vent.
14. The load lock system of any one of clauses 1-13, wherein the gas comprises nitrogen, helium, hydrogen, argon, CO2, or compressed air.
15. The load lock system of any one of clauses 1-14, further comprising a load lock chamber configured to enclose the first conditioning plate, the plurality of supporting structures, and the wafer.
16. The load lock system of clause 15, further comprising a first vacuum pump connected to the load lock chamber.
17. The load lock system of clause 16, wherein the controller is further configured to control the first vacuum pump to pump out the gas during a wafer conditioning process.
18. The load lock system of clause 17, wherein the controller is further configured to maintain a pressure inside of the load lock chamber in a range of 50 to 5,000 Pa during the wafer conditioning process.
19. The load lock system of any one of clauses 16-18, further comprising a second vacuum pump connected to the load lock chamber.
20. The load lock system of clause 19, wherein the controller is further configured to:
    enable the first vacuum pump to reduce pressure inside of the load lock chamber to a first pressure level, and
    enable the second vacuum pump to reduce pressure inside of the load lock chamber to a second pressure level, wherein the second pressure level is lower than the first pressure level.
21. The load lock system of clauses 20, wherein the second vacuum pump shares an exhaust path with a third vacuum pump connected to a main chamber.
22. The load lock system of any one of clauses 20 and 21, wherein the second vacuum pump is disabled while the first vacuum pump is enabled.
23. The load lock system of any one of clauses 20-22, wherein the first vacuum pump and the third vacuum pump are concurrently enabled.
24. A method of conducting a thermal conditioning of a wafer in a load lock system, comprising:
    loading a wafer to a load lock chamber of a load lock system;
    pumping down the load lock chamber;
    providing a gas to the load lock chamber; and
    enabling a first heat transfer element in a first conditioning plate to adjust a temperature of the first conditioning plate for transferring heat through the gas to the wafer.
25. The method of clause 24, wherein providing a gas to the load lock chamber further comprises conditioning a temperature of the gas before providing the gas to the load lock chamber.
26. The method of any one of clauses 24 and 25, wherein providing a gas to the load lock chamber further comprises providing the gas to a space between the first conditioning plate and the wafer.
27. The method of any one of clauses 24-26, further comprising determining a temperature of a wafer stage in a main chamber.
28. The method of any one of clauses 24-27, wherein enabling the first heat transfer element to adjust the temperature of the first conditioning plate further comprises adjusting the first heat transfer element based on the determined temperature of the wafer stage.
29. The method of any one of clauses 24-28, further comprising enabling a second heat transfer element in a second conditioning plate to adjust a temperature of the second conditioning plate for transferring heat through the gas to the wafer.
30. The method of any one of clauses 24-29, wherein the gas comprises nitrogen, helium, hydrogen, argon, CO2, or compressed air.

31. The method of any one of clauses 24-30, wherein pumping down the load lock chamber comprises pumping the gas out of the load lock chamber using a first vacuum pump connected to the load lock chamber.

32. The method of clause 31, wherein pumping down the load lock chamber further comprises:
enabling the first vacuum pump to reduce pressure inside of the load lock chamber to a first pressure level; and
enabling a second vacuum pump connected to the load lock chamber to reduce pressure inside of the load lock chamber to a second pressure level, wherein the second pressure level is lower than the first pressure level.

33. The method of clauses 32, wherein the second vacuum pump shares an exhaust path with a third vacuum pump connected to the main chamber.

34. The method of any one of clauses 32 and 33, wherein the second vacuum pump is disabled while the first vacuum pump is enabled.

35. The method of any one of clauses 32-34, wherein the first vacuum pump and the third vacuum pump are concurrently enabled.

36. A non-transitory computer readable medium including a set of instructions that is executable by one or more processors of a controller to cause the controller to perform a method conducting a thermal conditioning of a wafer, the method comprising:
instructing a first vacuum pump to pump down a load lock chamber of a load lock system after a wafer is loaded into the load lock chamber;
instructing a gas supply to provide a gas to the load lock chamber; and
instructing a first heat transfer element in a first conditioning plate to adjust a temperature of the first conditioning plate for transferring heat through the gas to the wafer.

37. The computer readable medium of clause 36, wherein the set of instructions that is executable by the one or more processors of the controller to cause the controller to further perform:
instructing a temperature sensor to determine a temperature of a wafer stage in a main chamber.

38. The computer readable medium of clause 37, wherein instructing the first heat transfer element in the first conditioning plate further comprises adjusting the first heat transfer element based on the determined temperature of the wafer stage.

39. The computer readable medium of any clauses 36-38, wherein the set of instructions that is executable by the one or more processors of the controller to cause the controller to further perform:
instructing a second heat transfer element in a second conditioning plate to adjust a temperature of the second conditioning plate for transferring heat through the gas to the wafer.

40. The computer readable medium of clause 39, wherein instructing the second heat transfer element in the second conditioning plate further comprises adjusting the second heat transfer element based on the determined temperature of the wafer stage.

41. The computer readable medium of any clauses 36-40, wherein the set of instructions that is executable by the one or more processors of the controller to cause the controller to further perform:
instructing the first vacuum pump to pump down the load lock chamber to a first pressure level; and
instructing a second vacuum pump to pump down the load lock chamber to a second pressure level, wherein the second pressure level is lower than the first pressure level.

42. A method of pumping down a load lock chamber, the method comprising:
pumping a gas out of the load lock chamber with a first vacuum pump configured to exhaust the gas to a first exhaust system; and
pumping the gas out of the load lock chamber with a second vacuum pump configured to exhaust the gas to a second exhaust system.

43. The method of clause 42, further comprising:
enabling the first vacuum pump to reduce pressure inside of the load lock chamber to a first pressure level; and
enabling the second vacuum pump to reduce pressure inside of the load lock chamber to a second pressure level, wherein the second pressure level is lower than the first pressure level.

44. The method of clause 43, wherein the second vacuum pump shares the second exhaust system with a third vacuum pump configured to pump down a main chamber.

45. The method of any one of clauses 42-44, wherein the second vacuum pump is disabled while the first vacuum pump is enabled.

46. The method of any one of clauses 44-45, wherein the first vacuum pump and the third vacuum pump are concurrently enabled.

Although the disclosed embodiments have been explained in relation to its preferred embodiments, it is to be understood that other modifications and variation can be made without departing the spirit and scope of the subject matter as hereafter claimed.

What is claimed is:

1. A load lock system, comprising:
a supporting structure configured to support a wafer;
a first sensor configured to measure a temperature of the wafer on the supporting structure; and
a controller including a processor and a memory, the controller configured to assist with thermal conditioning of the wafer before the wafer is transferred from the load lock system to a main chamber for inspection,
wherein the controller is further configured to assist with thermal conditioning of the wafer based on a temperature of a wafer stage in the main chamber.

2. The load lock system of claim 1, wherein the controller is further configured to set a target temperature of the wafer for thermal conditioning based on the temperature of the wafer stage in the main chamber.

3. The load lock system of claim 2, wherein the controller is further configured to finish the thermal conditioning of the wafer when the temperature of the wafer measured by the first sensor reaches the target temperature.

4. The load lock system of claim 2, wherein the target temperature is a stable temperature relative to the temperature of the wafer stage.

5. The load lock system of claim 1, wherein the controller is further configured to receive temperature information of the wafer stage in the main chamber.

6. The load lock system of claim 5, wherein the temperature information is acquired from a second sensor configured to measure the temperature of the wafer stage.

7. The load lock system of claim 1, wherein the controller is further configured to monitor the temperature of the wafer using the first sensor before the wafer is transferred from the load lock system to the main chamber.

8. The load lock system of claim 1, wherein when transferred to the main chamber, a temperature of the conditioned wafer is a stable temperature relative to a temperature of the wafer stage in the main chamber.

9. The load lock system of claim 1, further comprising: a gas vent configured to provide a gas having a conditioned temperature to adjust the temperature of the wafer,
   wherein the controller configured to assist with control of the gas to condition the wafer before the wafer is transferred from the load lock system to the main chamber.

10. The load lock system of claim 9, wherein the gas is thermally preconditioned to have the conditioned temperature before being provided via the gas vent.

11. A method for thermally conditioning a wafer before the wafer is transferred to a main chamber for inspection, comprising:
   placing the wafer on a supporting structure in a load lock system;
   setting a target temperature of the wafer on the supporting structure;
   monitoring a temperature of the wafer on the supporting structure using a first sensor that is configured to measure the temperature of the wafer; and
   thermally conditioning the wafer on the supporting structure before the wafer is transferred from the load lock system to the main chamber for inspection,
   wherein the target temperature is determined based on a temperature of a wafer stage in the main chamber.

12. The load lock system of claim 11, further comprising:
   finishing the thermal conditioning of the wafer when the temperature of the wafer measured by the first sensor reaches the target temperature.

13. The method of claim 11, further comprising:
   transferring the conditioned wafer from the load lock system onto the wafer stage in the main chamber.

14. The method of claim 11, wherein the target temperature is a stable temperature relative to the temperature of the wafer stage.

15. The method of claim 11, further comprising:
   receiving temperature information of the wafer stage in the main chamber.

16. The method of claim 15, wherein the temperature information is acquired from a second sensor configured to measure a temperature of the wafer stage.

17. The method of claim 11, wherein monitoring the temperature of the wafer on the supporting structure using the first sensor comprises:
   monitoring the temperature of the wafer using the first sensor before the wafer is transferred from the load lock system to the main chamber.

18. The method of claim 13, wherein when transferred to the main chamber, a temperature of the conditioned wafer is a stable temperature relative to a temperature of the wafer stage in the main chamber.

19. The method of claim 11, wherein thermally conditioning the wafer comprises:
   providing a gas having a conditioned temperature to adjust the temperature of the wafer.

20. The method of claim 19, wherein the gas is thermally preconditioned to have the conditioned temperature before being provided via the gas vent.

* * * * *